United States Patent [19]

Suzuki

[11] Patent Number: 5,097,291
[45] Date of Patent: Mar. 17, 1992

[54] ENERGY AMOUNT CONTROL DEVICE
[75] Inventor: Kazuaki Suzuki, Kawasaki, Japan
[73] Assignee: Nikon Corporation, Tokyo, Japan
[21] Appl. No.: 688,837
[22] Filed: Apr. 22, 1991
[51] Int. Cl.$^5$ .................... G03B 27/72; G03B 27/42
[52] U.S. Cl. ..................................... 355/69; 355/53
[58] Field of Search ................ 355/51, 53, 71, 69; 353/122

[56] References Cited

U.S. PATENT DOCUMENTS

| | | | |
|---|---|---|---|
| 4,619,508 | 10/1986 | Shibuya et al. | 353/122 |
| 4,624,551 | 11/1986 | Anzai et al. | 355/69 X |
| 4,884,101 | 11/1989 | Tanimoto | 355/69 X |
| 4,905,041 | 2/1990 | Aketagawa | 355/53 |
| 4,937,619 | 6/1990 | Fukuda et al. | 355/53 |
| 4,970,546 | 11/1990 | Suzuki et al. | 355/69 X |

*Primary Examiner*—Richard A. Wintercorn
*Attorney, Agent, or Firm*—Shapiro and Shapiro

[57] ABSTRACT

An energy amount control device having a pulse energy generating source which produces pulse energy with a predetermined range of energy fluctuations per oscillation, and adjusting voltage applied to the energy generating source to thereby control an energy amount of the pulse energy, the energy amount control device comprising a storage unit for storing information about the relation between predetermined voltage to produce pulse energy in the energy generating source and an energy amount of the pulse energy emitted from the energy generating source under the predetermined voltage; an energy amount measuring unit for detecting the energy amount of the pulse energy actually emitted from the energy generating source; an arithmetic unit for updating the information stored in the storage unit at predetermined timing based on the predetermined voltage to produce the pulse energy in the energy generating source and the energy amount detected by the energy amount measuring unit; and decision unit for determining the predetermined voltage corresponding to the energy amount of the pulse energy to be next emitted, based on the information updated by the arithmetic unit.

17 Claims, 14 Drawing Sheets

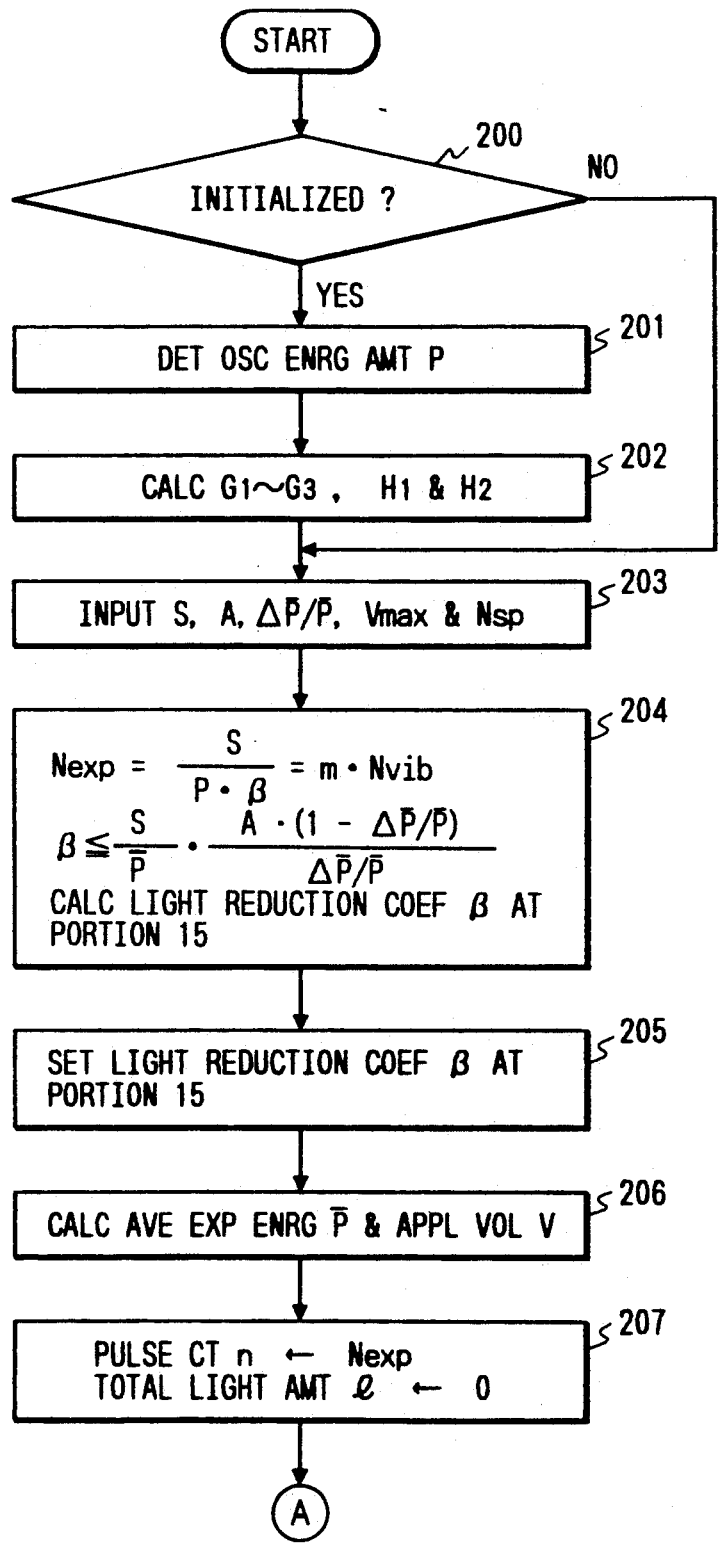

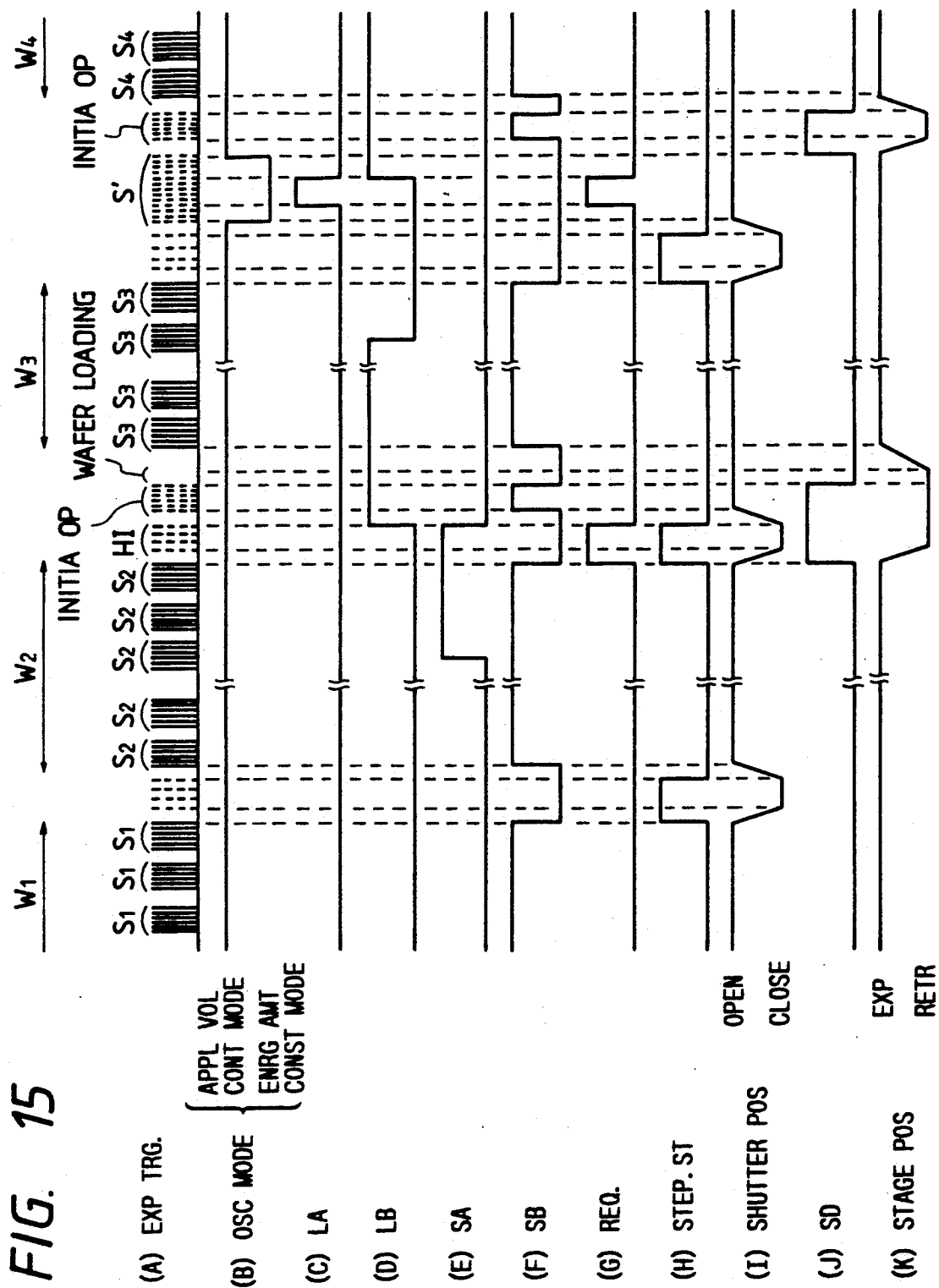

ENERGY AMOUNT CONTROL DEVICE

BACKGROUND OF THE INVENTION

1. Field of the Invention

The present invention relates to control of a total energy amount irradiated to a sensitive subject, and more particularly to control of a total irradiated energy amount in the case where the energy amount from an energy generating source of pulse oscillation type is changed over time. The present invention relates to, for example, an energy amount control device suitable for exposure amount control in an exposure apparatus using a pulse laser like an excimer laser as light for exposure.

2. Related Background Art

Recently, in exposure apparatus used in the photolithography process for manufacture of semiconductor devices, the minimum pattern size of circuits has become finer with a higher degree of integration of the devices. There have also been developed exposure apparatus using an excimer laser as a light source for exposure in place of a mercury lamp mainly used in the past. It is general that the excimer laser and a body of the exposure apparatus are connected by an interface cable such as an electric wire or optical fiber to emit a laser beam in accordance with the sequence of a main computer in the exposure apparatus body. Interfacing signals includes, for example, signals indicative of emission trigger, start of high-voltage charging, start and stop of oscillation, etc. which are transmitted from the exposure apparatus body to the excimer laser, and signals indicative of completed state on standby for oscilation, internal shutter position, interlock under operation, etc. which are transmitted from the excimer laser to the exposure apparatus body.

In this type exposure apparatus, illuminance may vary on the exposure surface because there occur on an exposure surface (reticle or wafer) a regular interference pattern due to coherent laser beams and an irregular interference pattern (speckle) due to superposition of multiple rays with different phases caused by flaws, dust pieces, surface defects or the like in an illumination optical system, along with variations on the order of ±10% per pulse of a laser beam. The above interference patterns, in particular, the regular interference pattern, greatly affects control of a pattern line width in the photolithography process. It has therefore been proposed to smooth the regular interference pattern and speckles (hereinafter referred to collectively as interference pattern) by using a method equivalent to one disclosed in U.S. Pat. No. 4,619,508 or Japanese Patent Laid-Open No. 1-259533 (corresponding U.S. patent Ser. No. 322,207, filed on Mar. 13, 1989), for example. Smoothing (conversion into an incoherent state) of the interference pattern disclosed in the above reference is carried out such that the laser beam is moved one-dimensionally or two-dimensionally (raster scan) at a constant period by a vibrating mirror (such as a galvano-mirror or polygon mirror) to spatially reduce a degree of coherency. Specifically, an incident angle of the laser beam upon illuminance equalizing means (optical integrator) is changed per pulse to move the interference pattern on a reticle for finally smoothing the interference pattern, namely, increase a degree of illuminance uniformity. At this time, a plurality of pulses are irradiated in synchronism with a one-dimensional or two-dimensional scan by the vibrating mirror. Since an oscillation pulse width of the excimer laser is usually very short on the order of 20 nsec, the vibrating mirror looks like still, as it were, during one pulse of the excimer laser even if it is vibrated at about 10 Hz.

Accordingly, to achieve smoothing (equalizing of illuminance) of the interference pattern by plural pulses and desired control accuracy of the exposure amount, it is important that (1) the energy amount per pulse is kept substantially constant during exposure, and (2) the target exposure amount is obtained with the number of pulses integer times as many as a half period of mirror vibrations in the one-dimensional or two-dimensional scan of the vibrating mirror.

Meanwhile, a laser light source shows a reduction in laser density not only in short term but also in long term. Such a reduction in laser density is significant in gas lasers; i.e., the output power is reduced due to deterioration of a gas mixture of active media sealed off within a chamber. In an excimer laser, for example, a gas mixture consisted of three types of gases, i.e., halogen gas such as fluorine, inert gas such as krypton or argon, and rare gas such as helium or neon, are sealed off within a laser chamber so that the halogen gas and the inert gas are reacted with each other under discharge in the chamber to emit a laser beam. However, as the laser beam is emitted repeatedly, the concentration of the halogen gas is reduced and so is pulse energy of the laser beam, because the halogen gas may couple with impurities generated in the chamber or deposit on the inner wall of the chamber. Generally, when the relation between the applied voltage (or the charged voltage) of an excimer laser light source and the energy amount of an exposure pulse emitted under that applied voltage is changed over time, for example, when the output power of the laser light source is lowered due to deterioration of a gas mixture of active media (e.g., reduction in the concentration of halogen gas), the desired oscillation energy amount cannot be obtained even if the applied voltage corresponding to the pulse energy amount to be next emitted is determined from the above relation.

A laser light source is usually operated in an applied voltage constant mode or an energy amount constant mode. In the case where the output power is lowered due to reduction in the concentration of halogen gas or the like in the energy amount constant mode, this power loss has been conventionally compensated for by receiving part of a laser beam to detect the energy amount, and feed-backing the detected value to the applied voltage in such a manner as to gradually increase the applied voltage between two electrodes in the chamber. Further, since the applied voltage has an upper limit, it has been required that when the applied voltage reaches the upper limit, halogen injection (HI) is effected to return the concentration of halogen gas to a proper value for reducing the applied voltage. But, with the HI operation repeated, an amount of impurities in the laser chamber is increased. In spite of carrying out the HI operation, therefore, the halogen gas couple with the impurities in more amount and the applied voltage is raised up at a faster rate due to a reduction in the gas concentration. As a consequence, the period of the HI operation is gradually shortened and, though the applied voltage is near the upper limit, the pulse energy amount will be gradually reduced. Accordingly, when the HI operation has failed to develop an effective result or when the pulse energy amount has reduced down to a predetermined value, it has been also required to partially replace three types of mixture gases, that is, so-called partial gas replacement (PGR). Until the PGR operation is required again, the HI operation is repeated in a like manner. The HI and PGR operations have been substantially automatically performed by commands from a control processor in the excimer laser light source.

With the conventional exposure apparatus as explained above, however, although the oscillation energy amount of substantially constant can be always obtained by oscillating the excimer laser light source in the energy amount constant mode, it is impossible to produce the desired oscillation energy amount (or the applied voltage corresponding to the oscillation energy amount) throughout a predetermined range of energy amount control. Stated otherwise, the oscillation energy amount cannot be precisely or finely performed per pulse and the exposure amount cannot be controlled with high precision, resulting in the problem such as reduced yield. In addition, since the HI and PGR operations are exclusively controlled on the laser light source side alone, it may well be that when wafers are exposed using the step and repeat technique, if the HI or PGR operation is carried out in an asynchronous manner during exposure of one shot area (that usually requires more than several tens pulses), exposure of that shot and further the next shot are damaged to a large extent.

SUMMARY OF THE INVENTION

An object of the present invention is to provide an energy amount control device which can achieve energy amount control of high precision by adjustment of the applied voltage even if the relation between the applied voltage of an energy generating source and the oscillation energy amount is changed over time.

Another object of the present invention is to provide an exposure apparatus which employs a laser light source requiring partial gas replacement, gas injection or the like, but which can achieve exposure amount control of high precision and prevent a reduction in yield due to the gas injection or the like.

To achieve the above objects, the present invention provides a device having an energy generating source 1 which emits pulse energy with a predetermined range of energy fluctuations per oscillation, and adjusting voltage applied to the energy generating source 1 to thereby control an energy amount of pulse energy, wherein the device comprises storage means [memory 7] for storing information about the relation between the applied voltage of the energy generating source 1 and the energy amount of the pulse energy emitted from the energy generating source 1 under the applied voltage; energy amount measuring means [energy monitoring element 4 and energy amount monitoring portion 5, or light receiving element 4' and light amount monitoring portion 5'] for detecting the energy amount of the pulse energy actually emitted from the energy generating source 1; arithmetic means [calculator 6] for updating the information about the relation between the applied voltage stored in the storage means and the energy amount per predetermined unit number of pulses or per unit time based on the applied voltage of the energy generating source 1 and the energy amount detected by the energy amount measuring means; and decision means [calculator 6] for determining the applied voltage of the energy generating source 1 corresponding to the energy amount of the pulse energy to be next emitted, based on the information updated by the arithmetic means.

In the present invention, the data about the relation between the applied voltage of the energy generating source (or the actual charged voltage during energy oscillation) and the oscillation energy amount is inputted per unit number of pulses or unit time, and the equation expressing the relation between the applied voltage and the oscillation energy amount stored beforehand in the storage means is updated sequentially. Therefore, even if the relation between the applied voltage or the charged voltage and the oscillation energy amount is changed over time, the equation expressing the relation is appropriately updated depending on the change over time so that satisfactory energy amount control can be always achieved.

Furthermore, the present invention provides an apparatus comprising an excimer laser light source 1 which requires partial gas replacement or gas injection and emits a pulse beam with a predetermined range of energy fluctuations per oscillation, and means [applied voltage control portion 11] for adjusting voltage applied to the laser light source, so that the plural pulse beams controlled by the adjusting means to a predetermined energy amount is irradiated to a reticle R to expose a pattern formed on the reticle R onto a sensitive substrate [wafer W] with a predetermined exposure amount, wherein the apparatus further comprises first control means [main control system 9] for outputting signals [demand signal SA and inhibit signal SB] indicative of whether the partial gas replacement or gas injection is required or not, depending on an exposure state of the sensitive substrate; second control means [control system 25] for outputting signals [demand signal LA and inhibit signal LB] indicative of whether the partial gas replacement or gas injection is required or not, depending on an oscillation state of the laser light source, and implementing the partial gas replacement or gas injection after detecting the time at which the partial gas replacement or gas injection of the laser light source is to be performed, based on the signals generated by the second control means and the signals applied from the first control means; storage means [memory 7] for storing information about the relation between the applied voltage of the laser light source and the energy amount of the pulse beam emitted from the laser light source on the reticle or wafer under the applied voltage; energy amount measuring means [energy monitoring element 4 and energy amount monitoring portion 5] for detecting the energy amount of the pulse beam actually emitted from the laser light source on the reticle or wafer; arithmetic means [calculator 6] for updating the information stored in the storage means per predetermined unit number of pulses or per unit time, or per implementation of the partial gas replacement or gas injection based on the applied voltage of the laser light source and the energy amount detected by the energy amount measuring means; and decision means [calculator 6] for determining the applied voltage of the laser light source corresponding to the energy amount of the pulse beam to be next emitted, based on the updated information.

In this form of the present invention, to avoid fluctuations in the laser output power caused by the partial gas replacement or gas injection carried out in an asynchronous manner on the laser light source side during exposure of at least one shot area, a demand condition and an inhibit condition for the partial gas replacement or gas injection are set for each of the laser light source and the exposure apparatus body depending on the oscillation sate of the laser light source and the exposure state of the sensitive substrate. Only when at least one of the two demand conditions is met and the two inhibit conditions are both not met, the laser light source is cooperatively controlled in association with the exposure apparatus body so as to implement the partial gas replacement or gas injection. Moreover, when controlling the applied voltage of the laser light source per pulse for purpose of exposure amount control, the data about the relation between the applied voltage of the laser light source (or the actual charged voltage during energy oscillation) and the pulse energy amount is inputted per unit number of pulses or unit time, or per implementation of the partial gas replacement or gas injection, and the equation expressing the relation between the applied voltage and the pulse energy amount stored beforehand in the storage means is updated sequentially.

Therefore, the implementation of the partial gas replacement or gas injection can be avoided during exposure of one shot area. Also, even if the relation between the applied voltage and the pulse energy amount is changed over time, the equation expressing the relation is appropriately changed depending on the change over time so that satisfactory exposure amount control can be always achieved.

BRIEF DESCRIPTION OF THE DRAWINGS

FIGS. 8, 8A and 8B is a flowchart showing one example of operation of the energy amount control device according to the second embodiment shown in FIG. 2;

FIG. 15 is a time chart showing another example of operation of the exposure apparatus shown in FIG. 10.

DESCRIPTION OF THE PREFERRED EMBODIMENTS

Figure 1:
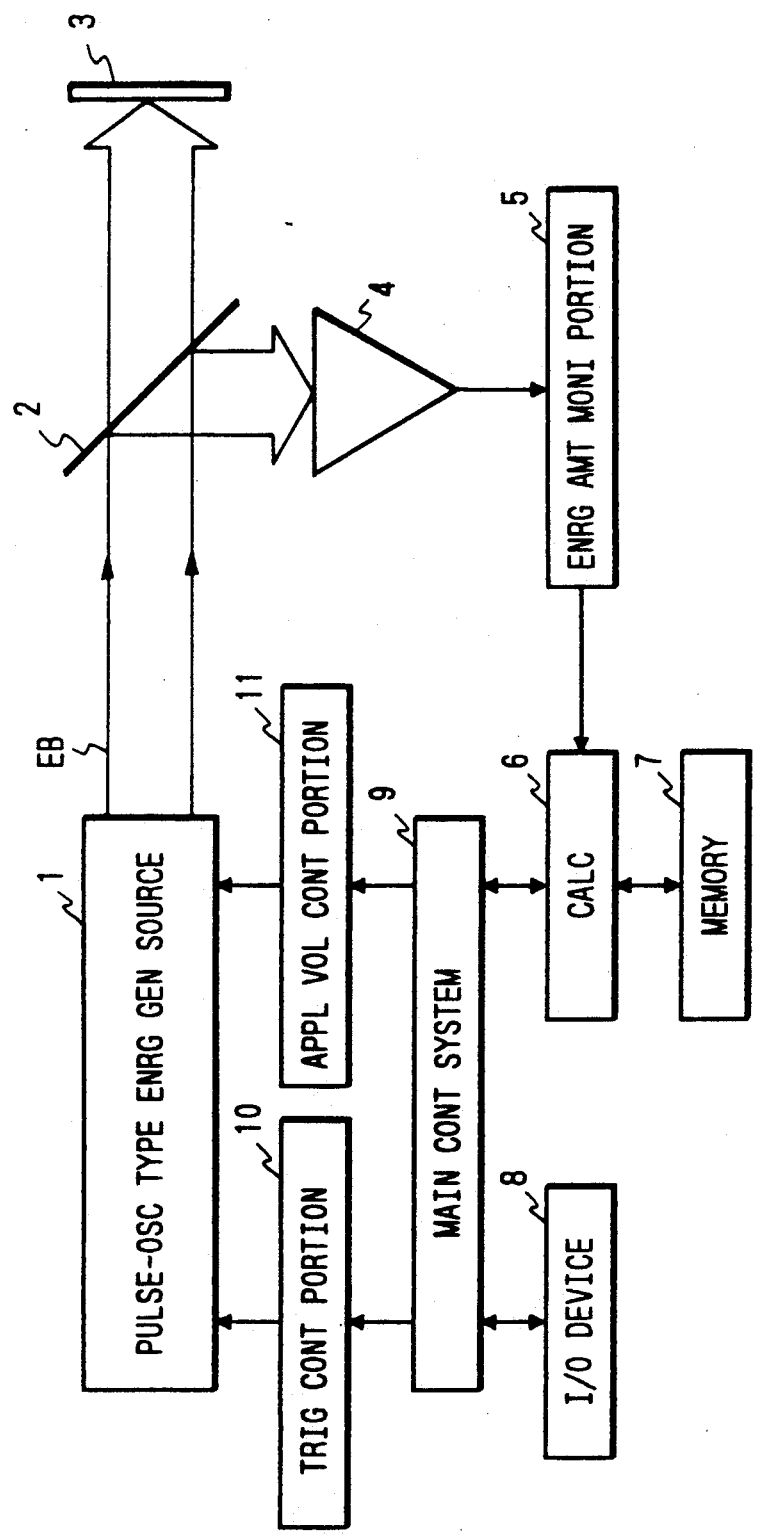
FIG. 1 is a block diagram showing the schematic configuration of an energy amount control device according to a first embodiment of the present invention.

FIG. 1 is a block diagram showing the schematic configuration of an energy amount control device according to a first embodiment of the present invention. For the sake of the simplest basic configuration, the illustrated embodiment is arranged to irradiate pulse energy radiated from a pulse oscillation type energy generating source 1 to an irradiated object 3 in accordance with preset oscillation conditions input from an input/output (I/O) device 8.

In FIG. 1, an applied voltage control portion 11 serves to control high discharge voltage (corresponding to applied voltage) of the pulse oscillation type energy generating source 1. Thus, the applied voltage control portion 11 provides the applied voltage, corresponding to the energy amount of the pulse energy to be next irradiated, to the energy generating source 1 for adjusting the energy amount per pulse. A trigger control portion 10 delivers an external trigger pulse to the energy generating source 1 and controls its oscillation (number of pulses, oscillation interval, etc.) after a preset charging time necessary for the energy generating source 1 has elapsed. The trigger control portion 10 and the applied voltage control portion 11 are both operated upon predetermined commands outputted from a main control system 9 (later described). The pulse energy radiated from the energy generating source 1 may be, for example, a coherent laser beam, an incoherent pulse beam, or pulse energy such as an electron ray other than light.

An energy beam EB emitted from the energy generating source 1 is divided into two beams by a beam splitter 2. A large part of the energy beam EB passes through the beam splitter 2 to be irradiated to the irradiated object 3. On the other hand, a small part of the energy beam EB reflected by the beam splitter 2 enters an energy monitor element 4 (e.g., a pyroelectric type power meter or PIN photodiode in the case of using an excimer laser). The energy monitor element 4 outputs a signal precisely depending on an energy amount of the energy beam EB per pulse. The output signal from the monitor element 4 is inputted to an energy amount monitoring portion 5 for conversion into the energy amount per pulse. Thus, the monitor element 4 and the energy amount monitoring portion 5 jointly constitute energy amount measuring means in the present invention to measure an energy amount of the energy beam which is associated in a predetermined relation with the energy beam irradiated to the irradiated object 3, i.e., which is uniquely defined by an optical capability of the beam splitter 2.

An actual measured value (which is not necessarily of an energy amount itself so long as it corresponds to the energy amount measured actually) measured by the energy amount monitoring portion 5 is sent to a calculator 6 which successively integrates the energy amount per pulse, and also updates information about the relation between the applied voltage of the energy generating source 1 and the oscillation energy amount under that applied voltage or the actual energy amount (so-called dose amount) applied to the irradiated object 3 (as described later in detail). As to the monitor element 4, the relation between the actual energy amount of the energy beam and sensitivity of the monitor element 4 is determined in advance by using a power meter and stored in a memory 7. Instead of determining the total energy amount in the calculator 6, the energy amount per pulse may be successively integrated in the energy amount monitoring portion 5. In this case, the energy amount monitoring portion 5 outputs the oscillation energy amount per pulse and the total energy amount to the calculator 6.

The calculator 6 includes arithmetic means for updating the relation between the applied voltage and the oscillation energy amount (or dose amount) in the present invention. Thus, the arithmetic means receives the above information stored in the memory 7, the applied voltage at the time of oscillation of the preceding pulse, and the oscillation energy amount from the energy amount monitoring portion 5 and, based on those data, updates the information about the applied voltage and the oscillation energy amount through predetermined arithmetic processing, followed by storing the updated information in the memory 7 (as described later in detail). The calculator 6 also includes decision means for, based on the total energy amount resulted from successively integrating the oscillation energy amount per pulse detected by the energy amount monitoring portion 5, determining the energy amount of the energy beam to be next irradiated in accordance with a predetermined energy amount control logic (described later). Then, based on the updated relation between the applied voltage and the oscillation energy amount, the calculator 6 makes arithmetic operation to determine the applied voltage corresponding to the pulse energy amount to be next irradiated, and sends it to the main control system 9.

The main control system 9 outputs command signals for the applied voltage and oscillation trigger pulse determined by the calculator 6 to the applied voltage control portion 11 and the trigger control portion 11, respectively. The I/O device 8 receives various parameters necessary for oscillation from the operator and, if required, informs the operator of the energy amount of the final pulse. The memory 7 stores the parameters (constants) necessary for oscillation operation, various arithmetic operations, etc. which have been entered from the I/O device 8, tables and so forth.

It is to be noted that FIG. 1 does not include means for (charged voltage measuring means in the present invention) for detecting the charged voltage between two electrodes (uniquely corresponding to the applied voltage of the energy generating source 1) at the time of energy oscillation in the energy generating source 1. Thus, this embodiment will be explained in connection with the case of not including the charged voltage measuring means. The case of providing the charged voltage measuring means in the energy generating source 1 only requires such a modification as to input a measured result from the charged voltage measuring means to the calculator 6 and update the information about the relation between the charged voltage, in place of the applied voltage, and the oscillation energy amount. For the reason, that modified case will not be explained here.

Figure 2:
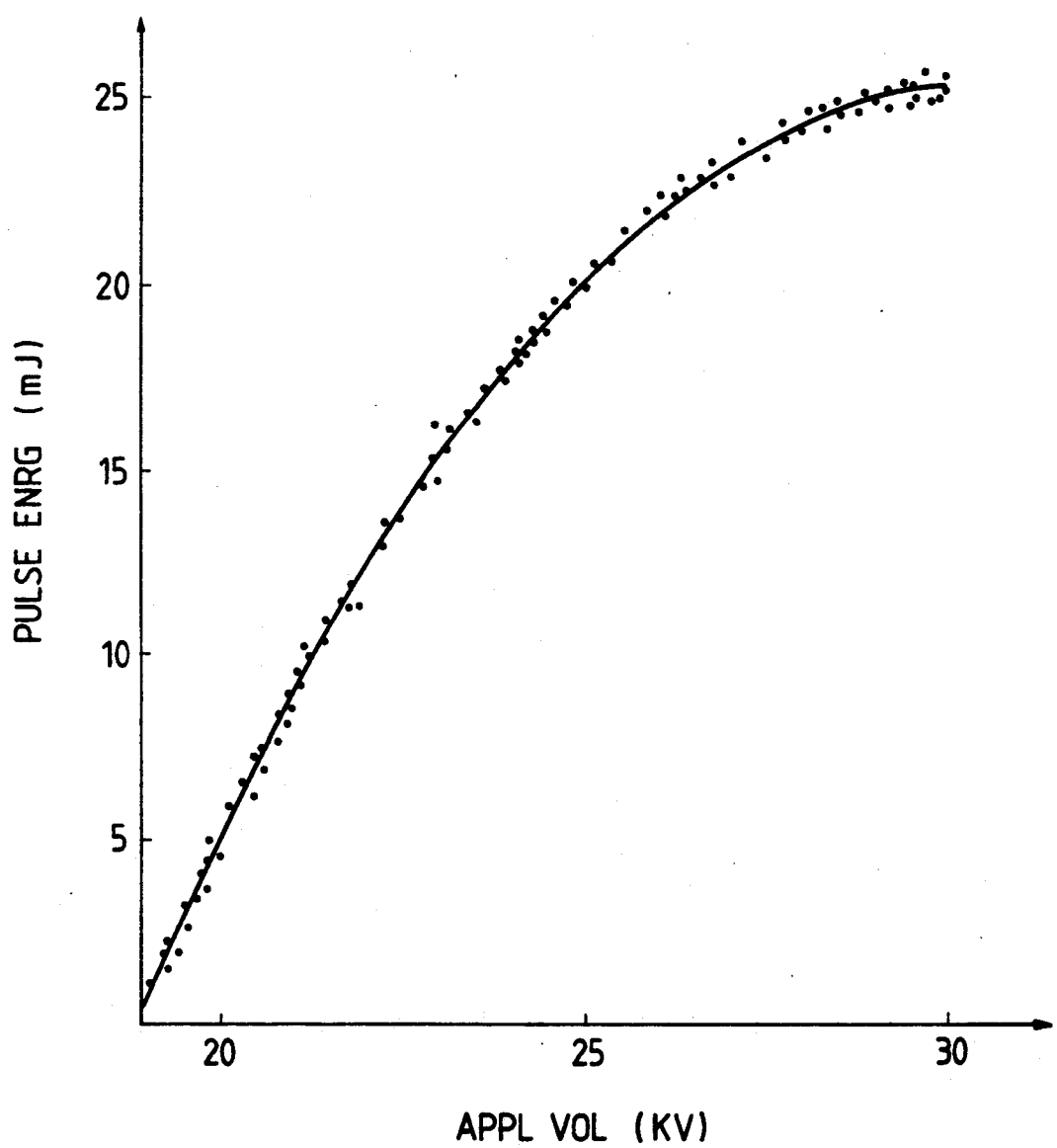
FIG. 2 is a graph showing one example of the relation between voltage applied to an energy generating source and an output power (pulse energy) under that applied voltage.

A manner of updating the information about the relation between the applied voltage and the oscillation energy amount, which manner is the main feature of the present invention, will be described below in detail. FIG. 2 is a graph showing one example of the relation between the applied voltage and the energy amount of the emitted pulse under that applied voltage. Here, the relation is represented in the form of a quadratic function. In FIG. 2, black circles stand for actual data and a solid line stands for a curve resulted from fitting the actual data to a quadratic using the least squares method. There will now be explained the fitting to a quadratic function by the least squares method. Note that while in this embodiment the least squares method is employed for fitting to a quadratic function, it is also possible to adopt a method of minimizing a maximum shift from data, for example, other than the least squares method explained below. Assuming that the applied voltage is V and the pulse energy amount is P, a model function is expressed by;

$$P = a + bV + cV^2 \quad (1)$$

where a, b and c are unknowns determined by the least squares method. Next, let it be assumed that respective data about the actual applied voltage and pulse energy amount are $V_i$ and $P_i$. The suffix i represents freshness of the data such that i=1 indicates the latest data and a larger value of i indicates the older data. Further, an evaluation function E is defined as follows:

$$E = \sum_{i=1}^{\infty} [\{P_i - (a + bV_i + cV_i^2)\} \cdot \gamma_i]^2 \quad (2)$$

where $\gamma_i$ is a weight (described later) for the data ($V_i$, $P_i$). The unknowns a, b, c which minimize the evaluation function E are determined based on the theory of the least squares method from the following equation (3) by solving ternary simultaneous equations;

$$\frac{\partial E}{\partial a} = 0, \frac{\partial E}{\partial b} = 0, \frac{\partial E}{\partial c} = 0$$

$$\begin{pmatrix} a \\ b \\ c \end{pmatrix} = B^{-1} \begin{pmatrix} \sum_{i=1}^{\infty} P_i \gamma_i^2 \\ \sum_{i=1}^{\infty} P_i V_i \gamma_i^2 \\ \sum_{i=1}^{\infty} P_i V_i^2 \gamma_i^2 \end{pmatrix} \quad (3)$$

where $$B = \begin{pmatrix} \sum_{i=1}^{\infty} \gamma_i^2 & \sum_{i=1}^{\infty} V_i \gamma_i^2 & \sum_{i=1}^{\infty} V_i^2 \gamma_i^2 \\ \sum_{i=1}^{\infty} V_i \gamma_i^2 & \sum_{i=1}^{\infty} V_i^2 \gamma_i^2 & \sum_{i=1}^{\infty} V_i^3 \gamma_i^2 \\ \sum_{i=1}^{\infty} V_i^2 \gamma_i^2 & \sum_{i=1}^{\infty} V_i^3 \gamma_i^2 & \sum_{i=1}^{\infty} V_i^4 \gamma_i^2 \end{pmatrix}$$

where $\gamma_i$ is a weight (described later) for the data ($V_i$, $P_i$). As mentioned before, the relation between the applied voltage V and the oscillation energy amount P is gradually changed over time (due to deterioration in a gas mixture within the chamber in the case of gas lasers). It is therefore required to make the weight for the latest data maximum (heaviest) and the weights for the older data lighter gradually, by setting the respective weights $\gamma_i$ to meet $\gamma_1 < \gamma_2 < \gamma_3 \ldots$ and so on. To this end, the weight $\gamma_i$ is defined below:

$$\gamma_i = \epsilon^{i-1} \tag{4}$$

where $\epsilon$ is a constant in a range of $0 < \epsilon < 1$. Practically, $\epsilon$ is a value preset depending on a change rate or the like of the relation between the applied voltage V and the oscillation energy amount P. Given $\epsilon = 0.995$, the distribution (weight) of the data $(V_i, P_i)$, relating to the oscillation pulse about 920 pulses before, to the evaluation function E is approximately 1% in comparison with the latest pulse. Accordingly, as will be seen from the equation (3), when the value of $\epsilon$ is set closer to 1, the unknowns a-c are determined from a large number of the data $(V_i, P_i)$, so that detection accuracy of the unknowns a-c can be prevented from being lowered due to variations (on the order of ±10%) of the energy amount per pulse. However, if the relation between the applied voltage V and the oscillation energy amount P is largely fluctuated in excess of the aforesaid order of fluctuations for some reason, it might be difficult to calculate the unknowns a-c in good following ability to the fluctuations without a lag because of a large number of the past data $(V_i, P_i)$. Conversely, if the value of $\epsilon$ is set closer to 0, the unknowns a-c are determined from a small number of the data $(V_i, P_i)$, resulting in that the following ability to the fluctuations in the aforesaid relation is improved, whereas the unknown values are greatly affected by the effect of fluctuations in the energy amount per pulse. For the reason, it is desirable in practice to set the value of the constant $\epsilon$ from experiments in consideration of balancing the above two opposite effects depending on stability of the energy generating source 1 and so forth.

Then, assuming that elements of the matrix on the right side of the above equation (3) are given by:

$$\left. \begin{array}{l} C_1 = \sum_{i=1}^{\infty} \gamma_i^2 = \dfrac{1}{1 - \epsilon^2} \\[4pt] C_2 = \sum_{i=1}^{\infty} V_i \gamma_i^2 \\[4pt] C_3 = \sum_{i=1}^{\infty} V_i^2 \gamma_i^2 \\[4pt] C_4 = \sum_{i=1}^{\infty} V_i^3 \gamma_i^2 \\[4pt] C_5 = \sum_{i=1}^{\infty} V_i^4 \gamma_i^2 \\[4pt] D_1 = \sum_{i=1}^{\infty} P_i \gamma_i^2 \\[4pt] D_2 = \sum_{i=1}^{\infty} P_i V_i \gamma_i^2 \\[4pt] D_3 = \sum_{i=1}^{\infty} P_i V_i^2 \gamma_i^2 \end{array} \right\} \tag{5}$$

these elements, i.e., parameters $C_1$-$C_5$, $D_1$-$D_3$, are stored, as the information about the relation between the applied voltage V and the oscillation energy amount P, in the memory 7. When the new data $(V_i, P_i)$, i.e., the latest data $(V_1, P_1)$, is obtained, the calculator 6 takes in the parameters $C_1$-$C_5$, $D_1$-$D_3$ from the memory 7 and updates the parameters $C_2$-$C_5$, $D_1$-$D_3$ using gradual equations below, other than the constant $C_1$ ($C_1 = 1/(1-\epsilon^2)$). Use of such gradual equations shortens the calculation time required to update the information about the relation between the applied voltage V and the oscillation energy amount P. The calculator 6 newly stores the updated information in the memory 7.

$$\left. \begin{array}{l} C_2 = V_1 + \epsilon^2 C_2 \\ C_3 = V_1^2 + \epsilon^2 C_3 \\ C_4 = V_1^3 + \epsilon^2 C_4 \\ C_5 = V_1^4 + \epsilon^2 C_5 \\ D_1 = P_1 + \epsilon^2 D_1 \\ D_2 = P_1 V_1 + \epsilon^2 D_2 \\ D_3 = P_1 V_1^2 + \epsilon^2 D_3 \end{array} \right\} \tag{6}$$

Meanwhile, solving the foregoing equation (1) for the applied voltage V and adopting only a positive solution ($V \geq 0$) leads to:

$$V = \dfrac{b}{2c} \left\{ \sqrt{1 - 4c(a - P)/b^2} - 1 \right\} \tag{7}$$

Thus, by calculating the equation (3) from the parameters $C_1$-$C_5$, $D_1$-$D_3$ sequentially updated by the equation (6) per unit number of pulses or unit time to determine the unknowns a-c, the relative equation (equation (1)) between the applied voltage V and the oscillation energy amount P can be updated to determine the applied voltage V, corresponding to the oscillation energy amount P of the next pulse determined by a predetermined energy amount control logic, using the equation (7).

Next, one example of the energy amount control logic of this embodiment will be described. Assuming that the target total energy amount applied to the irradiated object 3 by irradiation of plural pulses is $S_0$, the required energy amount control accuracy $A_0$ (where $0 < A_0 < 1$), variations in the oscillation energy amount between pulses under the same applied voltage is $\Delta P$ (e.g., $\Delta P/P =$ about 10%), and the oscillation energy amount corresponding to the maximum applied voltage Vmax in the equation (1) is Pmax (maximum value), an energy amount $P_1$ of the first pulse is determined below:

$$P_1 = \min\left( \dfrac{S_0 \cdot (1 + A_0)}{1 + (\Delta P/P)}, P_{\max} \right) \tag{8}$$

Also, given an energy amount of the k-th pulse being $P_k$, a total energy amount (actual measured value) $I_j$ until j-th pulse energy is expressed by:

$$I_j = \sum_{k=1}^{j} P_k \tag{9}$$

Accordingly, a (j+1)-th pulse energy amount $P_{j+1}$ is determined from the following equation. Note that min($\sigma$, $\rho$) implies that a lesser value of $\sigma$ and $\rho$ should be adopted.

$$P_{j+1} = \min\left( \frac{S_0 \cdot (1 + A_0) - I_j}{1 + (\Delta P/P)}, P_{max} \right) \quad (10)$$

The above energy amount control logic has an advantage that while a dynamic range (i.e., an adjusting range of the applied voltage V) of the energy control is large, the desired irradiation energy amount can be obtained from only a few pulses if the target total energy amount $S_0$ is so greater than the maximum pulse energy amount $P_{max}$.

Figure 3:
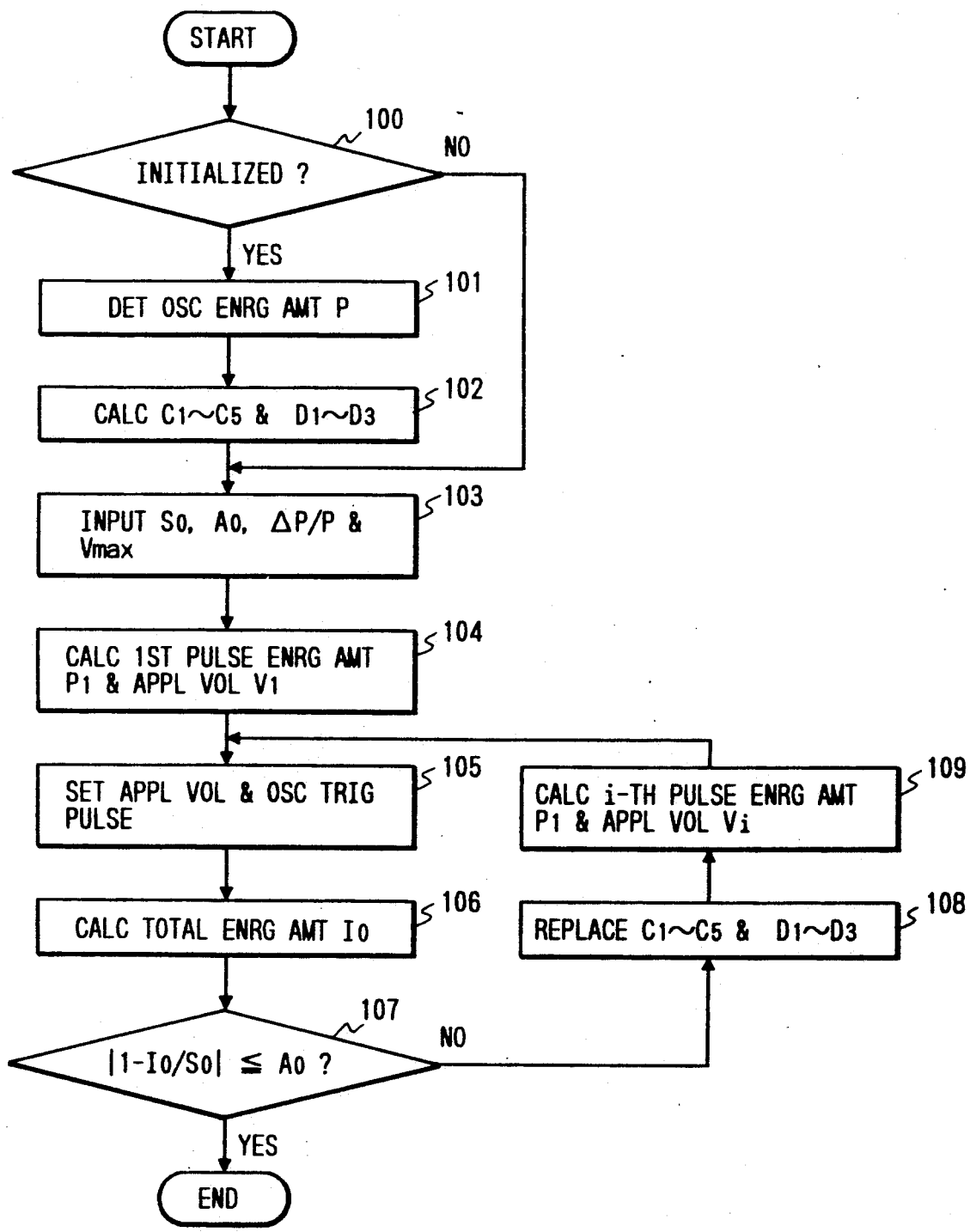
FIG. 3 is a flowchart showing one example of operation of the energy amount control device according to the first embodiment shown in FIG. 1.

Operation of this embodiment will be described below with reference to FIG. 3. FIG. 3 is a schematic flowchart showing one example of operation of this embodiment. In a step 100, it is determined whether or not the parameters $C_1$–$C_5$, $D_1$–$D_3$ stored in the memory 7 as the information about the relation between the applied voltage V and the oscillation energy amount P are to be initialized. This decision may be performed by the operator or automatically by a predetermined program. Practically, in the energy amount control device shown in FIG. 1, the calculator 6 determines whether or not to perform initialization, based on the oscillation stop time of the energy generating source 1, for example. Thus, if the energy generating source 1 keeps on oscillating, or if the stop time is short and the parameters $C_1$–$C_5$, $D_1$–$D_3$ in the memory are sufficiently reliable even though the oscillation is stopped, then the control goes to a step 103. On the other hand, if initialization is required, for example, if the energy generating source 1 is in a pumping state or its oscillation is kept stopped for a long time, then the control goes to a step 101. In the step 101, while successively changing the applied voltage V, the pulse energy amount P per pulse oscillated at each voltage value is inputted from the energy amount monitoring portion 5 to obtain the relation shown in FIG. 2, by way of example. Note that the measurement operation in the step 101 is finished in a short time and, therefore, the output power of pulse energy will not be lowered over time during the measurement operation. Further, the measurement operation is programmed in advance to be automatically implemented. In a next step 102, based on the data ($V_i$, $P_i$) obtained in the step 101, the calculator 6 calculates the parameters $C_1$–$C_5$, $D_1$–$D_3$ from the equation (6) and stores them in the memory 7.

In the next step 103, the calculator 6 receives the target total energy amount $S_0$ entered from the I/O device 8, as well as the energy amount control accuracy $A_0$, the variations ($\Delta P/P$) in the pulse energy between pulses and the maximum applied voltage $V_{max}$ stored in the memory 7. The variations ($\Delta P/P$) may be a value derived from the actual data ($V_i$, $P_i$) obtained in the above step 101. Then, the calculator 6 determines the first pulse energy amount $P_1$ following the equation (8), and calculates the equation (7) from the unknowns a–c derived based on the equation (3), thereby determining the applied voltage $V_1$ corresponding to the first pulse energy amount $P_1$ (step 104). Subsequently, the main control system 9 applies command signals depending on the result calculated by the calculator 6 to the applied voltage control portion 11 and the trigger control portion 10 and, after the applied voltage control portion 11 has finished setting of the applied voltage to the energy generating source 1, the trigger section 10 sends a trigger pulse to the energy generating source 1 upon completion of charging after the elapse of a predetermined time (step 105). As a result, the energy beam EB is emitted from the energy generating source 1 under a condition that variations of the pulse energy amount thereof is suppressed within ($\Delta P/P$).

Next, the energy amount monitoring portion 5 measures the oscillation energy amount based on the signal from the monitor element 4 and the calculator 6 successively integrates the energy amount per pulse, thereby calculating the total energy amount $I_0$ (step 106). In step 107, the calculator 6 determines whether or not the total energy amount $I_0$ (actual measured value) meets the energy amount control accuracy $A_0$. More specifically, it is determined whether or not the total energy amount $I_0$ meets the following equation (11). If the equation (11) is met, then one sequence of energy irradiation for the irradiated object 3 is brought into an end:

$$|1 - (I_0/S_0)| \leq A \quad (11)$$

On the other hand, if the equation (11) is not met, then the control goes to a step 108 where the parameters $C_1$–$C_5$, $D_1$–$D_3$ are replaced with new ones from the equation (6) based on the data ($V_1$, $P_1$). This employs the sequence in which the parameters are updated per pulse. In a next step 109, the calculator 6 determines the second pulse energy amount $P_2$ following the equation (10), and calculates the applied voltage $V_2$ corresponding to the first pulse energy amount $P_2$ from the equation (7), followed by returning to the step 105. In the step 105, the main control system 9 applies command signals depending on the calculated applied voltage $V_2$ to the applied voltage control portion 11 and the trigger control portion 10 similarly to the above operation. Then, the calculator 6 calculates the total energy amount $I_0$ (step 106) and, in a step 107, it is determined whether or not the total energy amount $I_0$ meets the equation (11). If the equation (11) is not met, then the control goes to the step 108 again, following which the steps 105–109 will be repeated executed until the equation (11) is met. At the time the equation (11) is met, the operation of irradiating energy is brought into an end.

By repeating the above operation, therefore, satisfactory energy amount control accuracy can be always achieved because even if the relation between the applied voltage V and the oscillation energy amount P is changed over time during irradiation of energy, the relative equation (equation (3)) expressing the relation is appropriately updated depending on the change over time.

Figure 4:
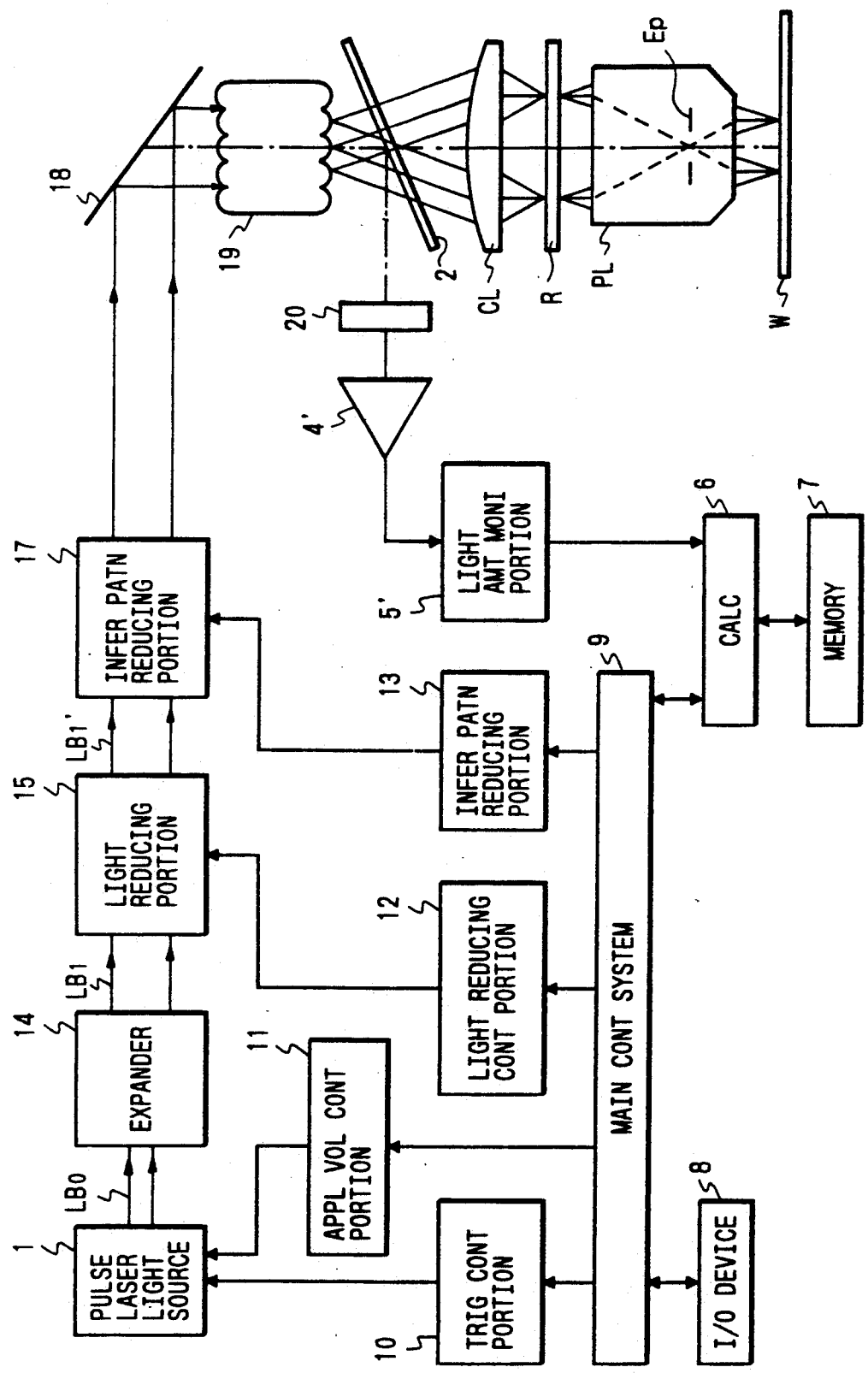
FIG. 4 is a view showing the schematic configuration of a stepper equipped with the energy amount control device according to a second embodiment of the present invention.

A second embodiment of the present invention will be described below with reference to FIGS. 4–7. FIG. 4 is a view showing the schematic configuration of the energy amount control device according to this embodiment. In the illustrated configuration, a pulse laser light source emitting a laser beam in a far-ultraviolet range is used as the energy generating source 1, and the energy amount control device is applied to a stepper for transferring a pattern of a reticle R onto a wafer W with a predetermined exposure amount. In FIG. 4, the components functioning and operating in the same manner as those in the first embodiment (FIG. 1) are denoted by the same reference numerals.

In FIG. 4, the trigger control portion 10 and the applied voltage control portion 11 serves to, as stated before in connection with the first embodiment, delivers a trigger pulse and the applied voltage corresponding to the energy amount of the pulse beam to be next irradiated, respectively, to the pulser laser light source 1 based on commands from the main control system 9. The pulse laser light source 1 is constituted as a laser light source includes two resonance mirrors arranged at both ends of the light source with a laser tube therebetween, a band-narrowing, wavelength-stabilizing mechanism interposed between the two resonance mirrors and comprising an etalon, dispersion element or the like, and a stabilizing resonator. By producing a high-voltage discharge between two electrodes disposed in parallel to the optical axis of a laser beam, a far-ultraviolet ray in such a wavelength range as able to expose a resist layer exposed, for example, a KrF excimer laser beam (wavelength: 248 nm) is oscillated.

A laser beam $LB_0$ emitted from the pulse laser light source 1 has a rectangular cross section corresponding to an arrangement of the two electrodes. Thus, a cross section of the laser beam is oblong with an aspect (height-to-width) ratio on the order of $\frac{1}{2}$-1/5. On this account, the laser beam $LB_0$ is led to enter a beam expander 14 (beam cross-sectional shape converting optical system) in combination of two sets of (concave and convex) cylindrical lenses. The beam expander 14 enlarges the width of the laser beam $LB_0$ on the short side and emits a laser beam $LB_1$ of which cross section is converted into substantially a square shape.

The laser beam $LB_1$ emerging from the expander 14 enters a light reducing portion 15 where a light amount (energy) of the beam is continuously or stepwisely attenuated between 0% (perfect transmission) and 100% (perfect cut-off). A light reducing control portion 12 sends a predetermined drive command to the light reducing portion 15 to control a light reduction coefficient (or transmissivity). The light reduction coefficient (or transmissivity) of the light reducing portion 15 is determined from the number of pulses Nexp necessary for actual exposure, which is in turn determined from both the number of pulses Nsp necessary for smoothing a interference pattern produced on the reticle R or wafer W and the number of pulses Ne necessary for controlling a total light amount applied to the wafer W at desired exposure amount control accuracy, as well as a correct exposure amount.

Assuming now that the light reduction coefficient of the light reducing portion 15 is set to vary in discrete six stages, for example, the light reduction coefficient is selected based on the number of pulses Nexp and the correct exposure amount prior to start of exposure, and will not be changed to another value during exposure of at least one shot. In other words, so long as conditions of exposure to the wafer W (e.g., a correct exposure amount per shot depending on sensitivity characteristics of a resist) is not changed, the light reducing portion 15 always attenuates the light amounts of all pulse beams evenly at a preset light reduction coefficient. This implies that a light amount adjusting mechanism with relatively low response speed (i.e., switching speed of the light reduction coefficient) can be used.

Figure 5:
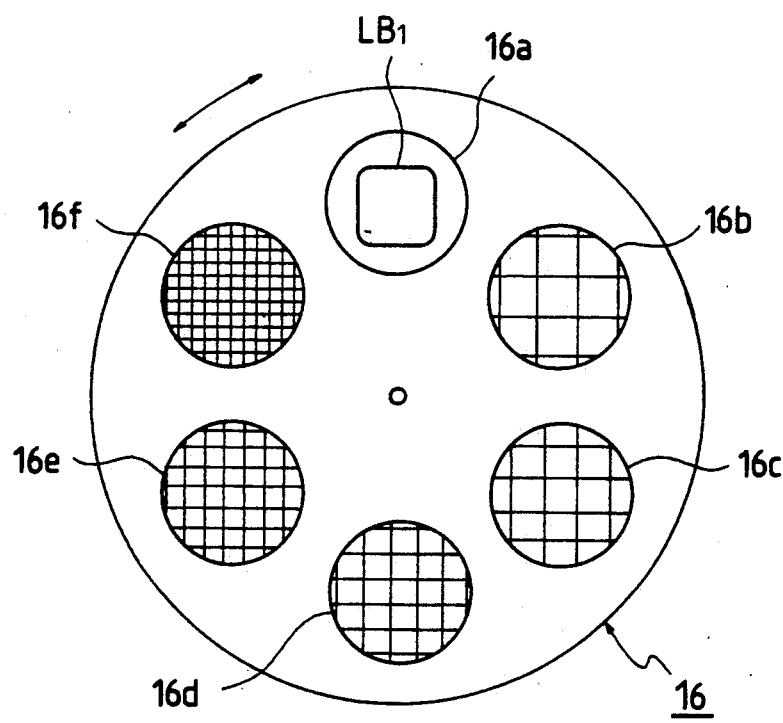
FIG. 5 is a constructive view showing one example of a rotary turret plate suitable for use in a light reducing portion.

The light reducing portion 15 suitable for use in this embodiment is designed, for example, such that six types of mesh filters having different attenuation coefficients (or transmissivities) are attached to a turret plate, and this turret plate is rotated. FIG. 5 shows one example of the structure of a rotary turret plate 16 and six types of mesh filters 16a-16f. The filter 16a is a simple opening (transparent region) and has the attenuation rate 0% (i.e., transmissivity 100%). The filters 16a-16f are respectively arranged at six positions along a circle about the axis of the rotary turret plate 16 with angular intervals of about 60°, such that any one filter is located in an optical path of nearly square beam $LB_1$ emerging from the expander 2.

Figure 6:
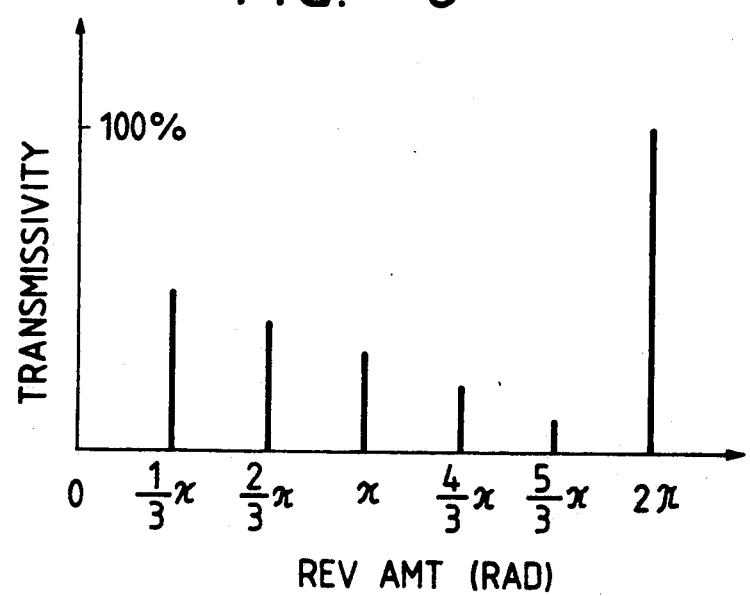
FIG. 6 is a graph showing the relation between a revolution amount and transmissivity of a light reducing element in the case of reducing a light amount by the rotary turret plate shown in FIG. 5.

FIG. 6 is a graph showing the relation between a revolution amount of the rotary turret plate 16 shown in FIG. 5 and transmissivity. This graph corresponds to the case where the revolution amount as given when the filter 16a is positioned in the optical path of the beam $LB_1$ is set to zero, and the rotary turret plate 16 is revolved counterclockwise in the drawing sheet of FIG. 5. In the example of FIG. 6, as the rotary turret plate 16 is revolved in units of about 60° ($\pi/3$), the light amount of the beam $LB_1$ is stepwisely at a predetermined rate. When the revolution amount reaches $2\pi$ (360° or 0°), the filter 16a is selected again so that the transmissivity becomes 100%.

As a light reducing element attached to the rotary turret plate 16, dielectric mirrors having different transmissivities may be also used other than the mesh filters. In an alternative case of providing two sets of rotary turret plates 16 to be revolvable relative to each other with a certain spacing therebetween, if light reducing elements of the first rotary turret plate have transmissivities of 100%, 90%, 80%, 70%, 60%, 50% and light reducing elements of the second rotary turret plate have transmissivities of 100%, 40%, 30%, 20%, 10%, 5%, total 36 values of transmissivity can be be achieved from a combination of the first and second rotary turret plates.

As additional alternatives, the light reducing portion 15 may be further designed, for example, such that an aperture of predetermined rectangular shape and a zoom lens system are combined with each other, and a zoom ratio or aperture diameter is changed to continuously reduce the light amount; that a so-called etalon comprising two glass sheets (e.g., quartz) held substantially in parallel to each other with a predetermined spacing is revolved; that two phase gratings or light-and-dark gratings are moved relative to each other; or that a polarizing plate is revolved in the case of using a linearly polarized laser beam as light for exposure.

Returning to the explanation of FIG. 4, a substantially parallel beam $LB_1'$, of which light amount is attenuated in the light reducing portion 15 at a predetermined light reduction coefficient, enters an interference pattern reducing portion 17 for smoothing an interference pattern. The interference pattern reducing portion 17 has a vibrating mirror (such as a galvano-mirror or polygon mirror) which vibrates one-dimensionally (or two-dimensionally) by an actuator (such as a piezo element) to change an incident angle of the beam $LB_1'$ upon a fly eye's lens 19 per pulse, so that the interference pattern is moved one-dimensionally (or two-dimensionally) on a reticle to be finally smoothed, i.e., to increase uniformity of illuminance.

More specifically, the beam $LB_1'$ having passed through the interference pattern reducing portion 17 becomes a vibrating beam which vibrates one-dimensionally (or two-dimensionally) at a small angle, following which the vibrating beam is reflected by a mirror 18 to enter the fly eye's lens 19 as an optical integrator. Accordingly, the beam $LB_1'$ entering the fly eye's lens 19 is changed in its incident angle from time to time in the incident plane of the fly eye's lens 19. The fly eye's lens 19 comprises a plurality of rod-like element lenses bundled together, and forms at its emergent end two-dimensional light source images (condensed spots of respective partial fluxes of the beam $LB_1'$ in this embodiment) in number corresponding to the number of the element lenses.

Figure 7:
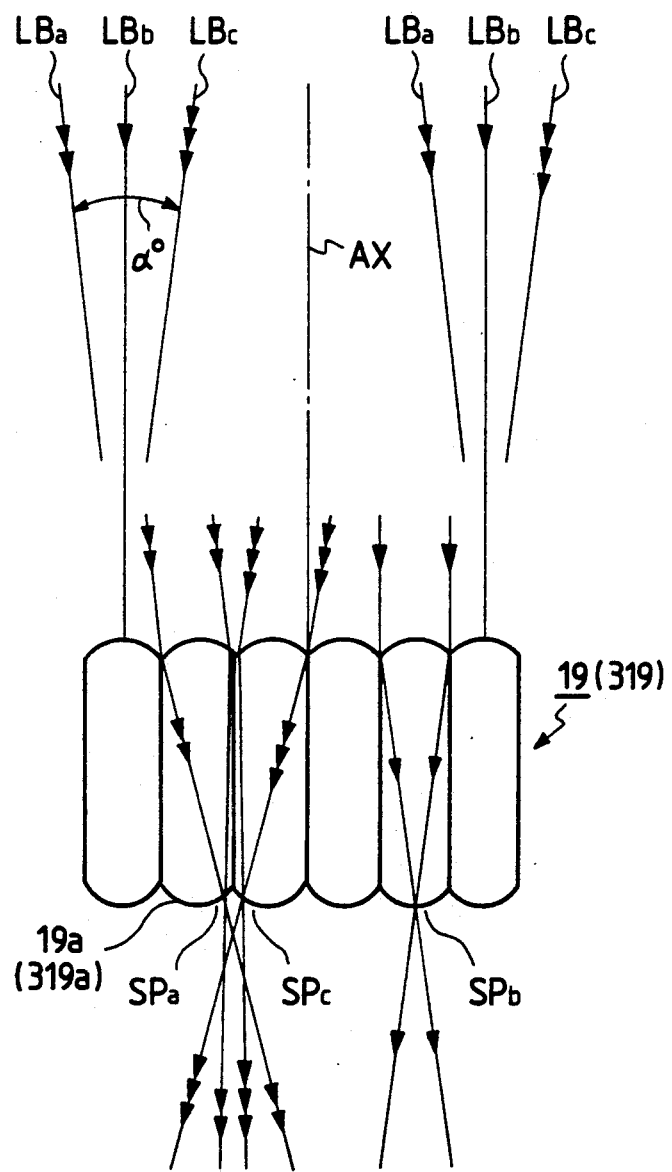
FIG. 7 is a view showing the schematic relation between a beam entering an optical integrator (fly eye's lens) and a two-dimensional image (spot light) of the beam.

FIG. 7 shows the relation between the incident beam upon the fly eye's lens 19 and the two-dimensional light source images (spot lights) thereof, and is a schematic explanatory view following the principles disclosed in the above-cited U.S. Pat. No. 4,619,508. Each rod lens 19a of the fly eye's lens 19 is a rectangular pillar of quartz glass formed with convex spherical surfaces at both ends. When a beam LBb (parallel flux) enters the fly eye's lens 19 in parallel to the optical axis AX, a spot light SPb is condensed at an emergent end of each rod lens 19a of the fly eye's lens 19, or a position away from the emergent end into the air by a predetermined distance. While the spot light SPb is illustrated in FIG. 7 only for one rod lens, it is practically formed on the emergent side of all the rod lenses to which the beam LBb is irradiated. In addition, each spot light SPb of the beam LBb is condensed substantially at the center on the emergent surface of the rod lens. On the other hand, when a parallel beam LBc inclined to the right from the optical axis AX enters the fly eye's lens 19, it is condensed as a spot light SPc in the emergent surface of each rod lens 19a on the left side. Likewise, when a parallel beam LBa inclined to the left from the optical axis AX enters the fly eye's lens 19, it is condensed as a spot light SPa in the emergent surface of each rod lens 19a on the right side. Accordingly, by vibrating the parallel beam $LB_1'$ one-dimensionally through the interference pattern reducing portion 13, the plurality of spot lights produced on the emergent side of the fly eye's lens 19 are all moved to one-dimensionally reciprocate at the same time with respect to the fly eye's lens 19 (optical axis AX).

A plurality of beams $LB_2'$ comprising to the respective spot lights, produced on the emergent side of the fly eye's lens 19 as mentioned above, pass in its large part through a beam splitter 2 shown in FIG. 4 and enter a condenser lens CL, following which they are superposed on the reticle R with each other. The reticle R is thereby illuminated with illuminance distribution almost uniform, so that a pattern of the reticle R is transferred onto a resist layer of the wafer W (corresponding to the irradiated object 3 in the first embodiment), placed on a stage (not shown), by a projection lens PL with a predetermined exposure amount. At this time, the plurality of spot lights produced on the emergent side of the fly eye's lens 19 are refocused in a pupil (entrance pupil) Ep of the projection lens PL which is tele-centric at least on the image (wafer) side, thereby constituting the so-called Keller's illumination system.

As explained above, the interference pattern reducing portion 17 serves to vibrate the beam incident upon the fly eye's lens 19 and thus move an interference fringe produced on the reticle or wafer surface in a small amount, whereby the light-and-dark fringe transferred onto the resist layer is eventually smoothed to reduce visibility of the interference fringe after the completion of exposure. Although the laser beam incident upon the fly eye's lens 19 is vibrated to smooth the interference pattern in this embodiment, a rotary diffusion plate may be revolved in synchronism with emission of the pulse beam, by way of example of other alternatives.

A small part of the beam $LB_2$ divided by the beam splitter 2 is condensed by a condensing optical system 20 on a light receiving surface of a light receiving element 4'. The light receiving element 4' serves to output a photoelectric signal precisely depending on the light amount (light intensity) of the beam $LB_2'$ per pulse, and comprises a PIN photodiode or the like which has sufficient sensitivity in a ultraviolet range. The photoelectric signal outputted from the light receiving element 4' is inputted to a light amount monitoring portion 5' for conversion into the actual light amount per pulse. The light receiving element 4' and the light amount monitoring portion 5' jointly constitute energy amount measuring means in the present invention. The energy amount thus measured is sent to the calculator 6 which successively integrates the energy amount per pulse. In the calculator 6, the actual measured value (light amount) becomes base data used for control of the exposure amount, updating of information about the relation between the applied voltage of the pulse laser light source 1 and the oscillation energy amount, as well as control of oscillation per shot of a trigger pulse oscillated from the trigger control portion 10. As to the light receiving element 4', the relation between the actual light amount of the energy beam irradiated to the wafer W and sensitivity of the light receiving element 4' is determined in advance by using a power meter and stored in the memory 7 with both the parameters being made associated with each other under a predetermined relation. Alternatively, the light amount monitoring portion 5' may successively integrate the light amount per pulse, followed by outputting the total light amount and the light amount per pulse to the calculator 6.

The calculator 6 includes means for updating the information about the relation between the applied voltage (or charged voltage) and the oscillation energy amount (or dose amount) in the present invention, and means for determining mining the applied voltage corresponding to the pulse energy amount to be next irradiated. The calculator 6 functions in the same manner as the above first embodiment except that it additionally serves to smooth the interference pattern (i.e., make illuminance more uniform) in this embodiment. Therefore, an energy amount control logic in the calculator 6 in this embodiment is different from that in the first embodiment and will be explained later in detail. It is needless to say that while charged voltage measuring means is not illustrated in FIG. 4 as with the first embodiment, the calculator 6 in this embodiment may be also arranged to update the information about the relation between the charged voltage, in place of the applied voltage, and the oscillation energy amount.

The main control system 9 outputs commands for the applied voltage and oscillation trigger pulse determined by the calculator 6 to the applied voltage control portion 11 and the trigger control portion 11, respectively. Also, the main control system 9 sends predetermined command signals relating to the light reduction coefficient and interference pattern control to the corresponding control portions based on the results of various arithmetic operations, thereby supervising and controlling overall operation of the stepper. As required, the main control system 9 further outputs the final total light amount (i.e., the total exposure amount to the wafer W) to the I/O device 8. The I/O device 8 is a man-machine interface between the operator and a stepper body, the interface serving to receive various parameters necessary for exposure from the operator and also informs the operator of operating conditions of the stepper.

The memory 7 stores the parameters (constants) necessary for exposure operation, various arithmetic operations, etc. which have been entered from the I/O device 8, tables, sensitivity characteristics of the light receiving element 4', and so forth. In this embodiment, particularly, the memory 7 stores the information for determining the number of pulses (Nvib described later) necessary at minimum to smooth the interference pattern satisfactorily during an interval in which the beam LB$_1$' is vibrated a half period by the interference pattern reducing portion 17. Here, the half period of the beam corresponds to such an operation that when the spot light is moved in the order of SPa→SPb→SPc (or reversely) in FIG. 7, the beam is inclined in the order of LBa→LBb→LBc (or reversely) by a swing angle $\alpha°$. Note that an actual tilt amount of the vibrating mirror is $\alpha°/2$ based on the angle doubling theory.

The calculator 6 calculates a light reduction coefficient $\beta$ of the light reducing portion 15 and a laterdescribed average light amount value ($\overline{P}\cdot\beta$) per pulse, based on data relating to the number of pulses Nsp necessary for smoothing the interference pattern, the number of pulses Ne necessary for achieving desired exposure amount control accuracy in exposure of one shot, and a correct exposure amount S per shot depending on sensitivity characteristics of a resist, the data being stored beforehand in the memory 7. The calculator 6 further calculates the target total light amount to be applied to the wafer W when each pulse will be repeatedly irradiated at the above average light amount value, and then a differential D between the resulting target total light amount and the actual total light amount derived by successively integrating the actual measured value (energy amount) sent from the light amount monitoring portion 5'. Afterward, based on the differential D, the calculator 6 calculates voltage applied to the pulse laser light source 1 and outputs information about the applied voltage to the main control system 9.

Stated otherwise, the calculator 6 determines the light amount of the pulse beam to be next irradiated by correcting the average light amount value ($\overline{P}\cdot\beta$) based on the differential D, followed by sending it to the main control system 9. Based on this corrected value, the applied voltage control portion 11 then controls the applied voltage of the pulse laser light source 1, namely, modifies the applied voltage by an amount corresponding to the corrected value and applies the modified voltage to the pulse laser light source 1. One example of the relation between the applied voltage of the pulse laser light source 1 and the light amount (pulse energy) of the pulse emitted under that applied voltage is as shown in FIG. 2.

Furthermore, the main control system 9 outputs a drive signal to the interference pattern control portion 13 so that the pulse emission in the pulse laser light source 1 is synchronized with a deflection angle of the beam caused by the interference pattern reducing portion 17. Such synchronization may be achieved by outputting oscillation start and stop signals to the trigger control portion 10 so that the pulse emission in the pulse laser light source 1 is triggered in precise following relation to the output of a detector which monitors the deflection angle of the beam with high accuracy.

The position at which the light reducing portion 15 is located is not limited to one shown in FIG. 4 and explained before. The similar operating effect can be also obtained in an alternative arrangement of placing it between the pulse laser light source 1 and the expander 14, or between two resonator mirrors in the pulse laser light source 1. In the case where the beam is not vibrated at a small angle by the interference pattern reducing portion 17, the light reducing portion 15 may be placed between the interference pattern reducing portion 17 and the fly eye's lens 19. Anyway, it is required for the light reducing portion 15 to be placed in some stage upstream of the point at which the laser beam enters the fly eye's lens 19. The reason is that since the light reducing element such as a mesh filter may often deteriorate uniformity of illuminance in the beam cross section, this deterioration must be solved through the fly eye's lens 19.

Next, there will be described the number of pulses Nsp necessary at minimum for smoothing the interference pattern (or making illuminance uniform). But, the smoothing of the interference pattern is disclosed in U.S. Pat. No. 4,970,546, by way of example, and will be thus briefly explained here. That U.S. Pat. is based on the principles that in the case of adopting an illumination optical system equipped with an optical integrator, particularly, a fly eye's lens, to smooth the interference pattern by irradiating a plurality of pulse beams while moving the interference pattern formed on the reticle (or wafer) in a certain range, the minimum number of pulses to be irradiated during movement of one pitch of the interference pattern is limited to a certain value in advance, and pulse beams in number not less than the minimum pulse number must be irradiated.

As also shown in FIG. 7, the interference pattern is produced by the spot lights, created by the respective rod lenses of the fly eye's lens 19, interfering with each other. It is therefore required to take into account the case, for example, where only the spot lights of every two adjacent rod lenses are interfered with each other, or where three spot lights in the direction of array of the rod lenses are interfered with each other; i.e., the case where the spot lights in number at maximum corresponding to the number of the rod lenses in the direction of array are interfered with each other.

Theoretically, therefore, the number of pulses Nsp necessary at minimum for satisfactory smoothing of the interference pattern and the minimum number of pulses Nvib (Nvib being such an arbitrary integer as to meet Nvib $\geq$ N) to be irradiated during a half period of the beam swing caused by the vibrating mirror to move the interference pattern by one pitch are both determined depending on the number of those spot lights, which can interfere with each other, of the total number of the rod lenses juxtaposed in the direction of array to thereby constitute the fly eye's lens 19.

When only the two adjacent spot lights are interfered with each other, for example, intensity distribution of the resulting interference pattern theoretically exhibits a simple shape of sinusoidal wave from mathematics. In order to smooth such the interference pattern, it is just required to shift a phase difference between the two spot lights by $\pi$ (i.e., move the interference pattern by ½ period), and irradiate one pulse in each of spaced timings, that is, two pulses in total. Generally, when n spot lights are interfered with each other, the interference pattern can be theoretically smoothed by irradiating one pulse while moving the interference pattern in units of 1/n period, that is, n pulses in total.

Considering now intensity distribution in one direction (e.g., Y-direction) of the interference pattern produced on the reticle by emission of one pulse, it is general that light and dark stripes lie alternately in the Y-direction with a predetermined pitch Yp. Depending on a modification of the fly eye's lens such as a two-stage arrangement, however, a weak interference fringe may appear in superposed relation with its light intensity changing at a finer pitch other than fundamental components of the pitch Yp which is determined by an array pitch of the rod lenses of the fly eye's lens, wavelength of the laser beam, etc. In practice, therefore, the perfect smoothing of the interference pattern can be achieved in a very few cases only under the above setting conditions. This means that an optimum value of the minimum pulse number Nsp necessary for smoothing the interference pattern is required to be determined from experiments or the like.

In this embodiment, based on the minimum pulse number Nsp derived from experiments, an angle change of the vibrating mirror (not shown) and an interval of emitted pulses (i.e., frequency) are set to meet the relation of $n \cdot \Delta Y \geq Yp$. Then, the interference pattern is successively shifted in the Y-direction by a small amount $\Delta Y$ ($\Delta Y < Yp$) on the resist layer for each emission of one or more pulses, so that the interference pattern is smoothed (to make illuminance uniform) at the completion of exposure, thereby substantially constant illuminance distribution that includes only a minimum amount of ripples on the order of not affecting accuracy.

Considering now conditions necessary to achieve uniformity of illuminance, the following two conditions can be taken.

(1) Pulse emission should be carried out almost evenly in number not less than a certain number Nsp within a half period of the mirror vibration (i.e., during an interval in which the beam swing angle changes from 0° to α°).

Here, the pulse number Nsp depends on visibility of the interference pattern such that the higher visibility, the greater value Nsp will be. Also, the pulse number Nsp is determined in advance from experiments such as trial exposure and thus has a different value in apparatus equipped with different optical systems. Accordingly, if the pulse emission is allocated almost evenly in number smaller than Nsp within the half period of change in the beam swing angle (0°→α°), uniformity of illuminance (or illumination unevenness in the image plane) would not be kept within a desired range of accuracy.

(2) Average exposure energy per pulse at a certain angle of the vibrating mirror should be almost constant at any angles within the beam swing range (0°→α°).

This second condition can be satisfied by so setting that the total pulse number Nexp actually necessary for exposure of one shot is integer time(s) as many as the pulse number Nvib during the half period of the beam swing, and that the first pulse emission is started at the maximum angle (e.g., the angle 0° at which the beam LBa is obtained in FIG. 4) of the mirror vibration (0°−α°/2). When the pulse number Nexp is integer time(s) as many as the number of pulses within one period of the mirror vibration (0°−α°/2), the first pulse emission may be started at any angle of the mirror vibration (0°−α°/2).

Thus, by adjusting average exposure energy per pulse and determining the optimum number of pulses so as to meet the above two conditions (1), (2) simultaneously, uniformity of illuminance and control of exposure amount can be both achieved highly effectively. In addition, by changing not only the exposure energy but also the vibration period (swing speed) of the vibrating mirror, it will not be required to increase the number of exposure pulses more than necessary, which is advantageous in throughput.

Taking into account variations in the exposure energy per oscillation pulse, the applied voltage of the pulse laser light source 1 is set to a value slightly smaller than the maximum applied voltage Vmax of the pulse laser light source 1. In the exposure of one shot, after emitting the first pulse beam under that setting value, the main control system 9 successively controls the applied voltage for each of second and subsequent pulse beams to a voltage value calculated by the calculator 6. On this account, there will now be explained a range of exposure energy control under the applied voltage control of the pulse laser light source 1. Assuming that the average exposure energy per pulse is $\overline{P}$ (with the light reduction coefficient of the light reducing portion 15 being 1), variations in the average exposure energy between pulses is $\Delta \overline{P}$, and the pulse beam is emitted in number N during exposure of one shot, the variation in the actual total light amount I relative to the target total light amount $\overline{P} \cdot N$ (S=$\overline{P} \cdot N$ using the correct exposure amount S) can be expressed by the following equation (12):

$$P\left( N - (\Delta P/\overline{P}) \cdot \frac{1 - (\Delta P/\overline{P})^N}{1 - (\Delta P/\overline{P})} \right) \leq I \leq \quad (12)$$

$$P\left( N + (\Delta P/\overline{P}) \cdot \frac{1 - (\Delta P/\overline{P})^N}{1 - (\Delta P/\overline{P})} \right)$$

As will be seen from the equation (12), a control factor of the light amount in the applied voltage control is given by $\{1 \pm (\Delta \overline{P}/\overline{P})/(1 - \Delta \overline{P}/\overline{P})\}$ where $0 < \Delta \overline{P}/\overline{P} < 1$ and the pulse number N is an integer of fairly large value. To keep a maximum value $\{1/(1 - \Delta \overline{P}/\overline{P})\}$ of the control factor not beyond a maximum value of the exposure energy control range, therefore, it is just required to select the average exposure energy control value set before exposure to be not larger than a value $(1 - \Delta \overline{P}/\overline{P})$ time as many as the maximum value of the above control range.

In practice, it is just required to set the applied voltage of the pulse laser light source 1 (or the discharge voltage between electrodes) at which the desired exposure energy is obtained based on the relation shown in FIG. 2, so that the average exposure energy P becomes not larger than a value $(1 - \Delta \overline{P}/\overline{P})$ time as many as the maximum output power of the pulse laser light source 1. In the case of an excimer laser, for example, $(\Delta \overline{P}/\overline{P})$=about 10% has usually proved. Thus, assuming that the exposure energy at the maximum applied voltage of the pulse laser light source 1 is 10 mJ/cm², it is required to set the applied voltage so that the exposure energy $\overline{P}$ becomes not larger than 9 mJ/cm². Practically, taking into account a reduction in the laser density (reduction in the output power due to deterioration of a gas mixture), service life of optical parts and so forth, the applied voltage is desirably set so that the exposure energy $\overline{P}$ becomes not larger than 5 mJ/cm², by way of example.

In this embodiment, since the light reduction coefficient of the light reducing portion 15 is changed depending on conditions of exposure to the wafer W (such as types of resist and correct exposure amount), the exposure energy of the second and subsequent pulse beams is finely adjusted only to compensate for an error of the total light amount due to variations between pulses. This eliminates the need of changing the discharge voltage between electrodes to a large extent by the pulse laser light source 1 and thus allows a shorter dynamic range of the applied voltage control portion 11. Consequently, the relation between the applied voltage and the exposure energy during exposure of one shot can be represented by using only a very small part of the curve shown in FIG. 2, with the result that the relative equation can be well approximated by a linear equation.

There will now be briefly explained the number of pulses Ne necessary for achieving the desired exposure amount control accuracy A ($A = |1 - 1/\overline{P} \cdot N|$) during exposure of one shot. Because the exposure amount control in this embodiment is carried out in such a manner as to make the actual total light amount I substantially coincident with the target total light amount $\overline{P} \cdot N$ while adjusting the exposure energy per pulse, the final error of the total light amount results in variation in the exposure energy of the final pulse beam. To achieve the desired exposure amount control accuracy, therefore, the variation in the exposure energy of the final pulse must be kept within an allowable error of the exposure amount control accuracy. In other words, the exposure energy P must be set to a small value and the number of pulses N ($N = S/\overline{P}$) necessary for exposure of one shot must be a fairly large number. By so setting, $(\Delta \overline{P}/\overline{P})^N$ in the equation (12) can be regarded as zero. Accordingly, by rearranging the equation (12) after dividing both sides by $\overline{P} \cdot N$, the exposure amount control accuracy A is expressed by:

$$A \leq \frac{1}{N} \cdot \frac{(\Delta P/P)}{1 - (\Delta P/P)} \tag{13}$$

Thus, the number of pulses N necessary for achieving the desired exposure amount control accuracy becomes least when the exposure amount control accuracy A in the equation (13) takes an allowable maximum value, i.e., when the following equation holds:

$$A = \frac{1}{N} \cdot \frac{(\Delta P/P)}{1 - (\Delta P/P)} \tag{14}$$

The above pulse number Ne is thereby expressed below:

$$Ne = \frac{1}{A} \cdot \frac{(\Delta P/P)}{1 - (\Delta P/P)} \tag{15}$$

As a result, by performing the exposure with pulse beams in number not less than the pulse number Ne expressed by the equation (15), it is ensured that the final total light amount I is made coincident with the target total light amount $\overline{P} \cdot N$ with control accuracy of $\pm A$ (e.g., A=0.01 in the case of 1%).

A manner of determining the number of pulses Nexp necessary for exposure of one shot will be explained below. Generally, the exposure pulse number Nexp is given by Nexp=iNT(S/$\overline{P}$) where iNT($\omega$) implies an integer value resulted from raising the decimal of a real value $\omega$ to a unit.

The pulse beam oscillated by the pulse laser light source 1 is evenly attenuated by the light reducing portion 15 at the predetermined light reduction coefficient $\beta (0 \leq \beta \leq 1)$ and irradiated to the reticle R. Therefore, the exposure pulse number Nexp is required to meet the following conditional equation (16):

$$Nexp = \frac{S}{\overline{P} \cdot \beta} \tag{16}$$

To achieve the above-stated exposure amount control accuracy A, the following equation (17) must be also met:

$$Nexp \geq Ne \tag{17}$$

In addition, to smooth the interference pattern, the exposure pulse number Nexp must be integer time(s) as many as the pulse number Nvib during the half period of the vibrating mirror. Thus, the exposure pulse number Nexp is expressed by the following equation (18):

$$Nexp = m \cdot Nvib \geq m \cdot Nsp \text{ (m: integer meeting } m \geq 1\text{)} \tag{18}$$

Accordingly, the light reduction coefficient $\beta$ of the light reducing portion 15 is expressed below from the equations (15)-(17):

$$\beta \leq \frac{S}{\overline{P}} \cdot \frac{A\{1 - (\Delta P/P)\}}{(\Delta P/P)} \tag{19}$$

From the equations (15), (17) and (18), the integer m is expressed by the following equation (20):

$$m \geq \frac{1}{Nvib} \cdot \frac{1}{A} \cdot \frac{(\Delta P/P)}{1 - (\Delta P/P)} \tag{20}$$

Since the light reduction coefficient $\beta$ is not larger than 1, the integer m is further expressed by:

$$m \geq \frac{S}{\overline{P} \cdot Nvib} \tag{21}$$

In view of the above, operation of this embodiment first sets the light reduction coefficient of the light reducing portion 15, namely, selects one filter of the rotary turret plate 16, so as to meet the equation (19). Then, it is checked whether or not the exposure pulse number Nexp calculated from the equation (16) under the light reduction coefficient of the selected filter meets the equations (17) and (18). If not, then another filter with the smaller light reduction coefficient to meet the equation (19) is selected so that the exposure pulse number Nexp meets the equations (17) and (18). After the exposure pulse number Nexp has been thus determined, m and Nvib are then determined so as to meet the equations (20) and (21) simultaneously.

Assuming that variations $\Delta \overline{P}/\overline{P}$ in the average exposure energy between pulses is 10% ($\Delta \overline{P}/\overline{P}$=0.1) and the exposure amount control accuracy A is 1% (A=0.01), the pulse number Ne becomes 12 from the equation (15). On the other hand, assuming that the average exposure energy $\overline{P}$ as obtained with the light reduction coefficient $\beta$ of the light reducing portion 15 being 1 is 2 mJ/cm$^2$, the correct exposure amount S is 80 mJ/cm$^2$, and the pulse number Nsp necessary for smoothing the interference pattern is 50, the exposure pulse number Nexp is given by 40 from the equation (16). But, this exposure pulse number Nexp does not meet the equation (18). Therefore, the light reduction coefficient of the light reducing portion 15 is set smaller than 1 so that the exposure pulse number Nexp calculated from the equation (16) meets the equation (18) under the newly set the light reduction coefficient, i.e., the average exposure energy $\overline{P} \cdot \beta$.

In the case where the light reduction coefficient $\beta$ of the light reducing portion 15 can be set in a continuous manner, m and Nvib are set based on the equations (20), (21) using Ne=12, Nsp=50 (pulses). At this time, there are possibly various combinations of (m, Nvib) such as (1, 50), (1, 60) and (2, 100), for example. But, to minimize the exposure pulse number Nexp (Nexp=m·Nvib) from the standpoint of throughput, the combination of m=1 and Nvib=50 is here set to give the exposure pulse number Nexp as 50 pulses. By carrying out the exposure under Nexp=50, it is possible to optimize the exposure amount and smooth the interference pattern with the minimum pulse number Nexp. As a result, the light reduction coefficient $\beta$ of the light reducing portion 15 is set to 0.80 from the equation (16). Further, from $\Delta \overline{P}/\overline{P} = \pm 10\%$, $\Delta \overline{P}$ is given by $\pm 0.2$ mJ/cm$^2$ and the variations $\Delta \overline{P} \cdot \beta$ in the average light amount value $\overline{P} \cdot \beta$ is given by $\pm 0.160$ mJ/cm$^2$. In other words, the variation in the average light amount value of the final pulse beam, that is, the error of the final total exposure amount, can be regarded on the order of $\pm 0.160$ mJ/cm$^2$. It is thus found that the exposure amount control accuracy (1%) can be achieved sufficiently.

Meanwhile, in the case where the light reduction coefficient $\beta$ of the light reducing portion 15 is set in a discontinuous manner (e.g., where the light reducing portion 15 is of a rotary turret plate or the like), one mesh filter of the rotary turret plate 16 which meets the equation (19) is first selected. Then, it is checked whether or not the pulse number Nexp calculated from the equation (16) under the light reduction coefficient (e.g., $\beta=0.5$) of the selected filter meets the equation (18). At this time, to minimize Nexp, the filter is selected in turns out of those filters meeting the equation (19) from one with the greatest light reduction coefficient. In the case of $\beta=0.50$ (that is, $\overline{P} \cdot \beta = 1$ mJ/cm$^2$), Nexp=80 pulses is resulted which meets the equations (17), (18). Once the pulse number Nexp is once determined in this way, what is left to be done is only to determine m, Nvib meeting the equations (20), (21) simultaneously from Nexp=80; i.e., m=1, Nvib=80 in this case.

As will be apparent from the foregoing, when the light reduction coefficient of the light reducing portion 15 is set in a discontinuous manner, the light reduction coefficient cannot be always set to an optimum value determined through calculations and, therefore, the resulting pulse number Nexp becomes larger than the case where the light reduction coefficient can be set in a continuous manner, with the disadvantage of a reduction in throughput. For that reason, it is desirable to arrange the light reducing portion 15 such that the light reduction coefficient can be set continuously, or in the case of discontinuous type, to arrange it such that the attenuation coefficient (or transmissivity) can be set finely (for example, by a combination of two rotary turret plates.

Next, there will be described in detail a method of updating information about the relation between the applied voltage and the oscillation energy amount, which is a main feature of this embodiment. As stated before, since a dynamic range of the exposure energy control under the applied voltage control is small, only part of the curve shown in FIG. 2 is utilized. Therefore, the relation between the applied voltage and the oscillation energy amount can be well approximated by a linear function. This implies that when fitting a function to the relation between the applied voltage and the oscillation energy amount, we can proceed a discussion using a linear function. Thus, a model function in this embodiment is expressed below;

$$P = s + tV \tag{22}$$

where s, t are unknown parameters determined by the least squares method. Furthermore, in this embodiment, an evaluation function E is defined as follows, taking into account a weight $\gamma_i$ applied to the data $(V_i, P_i)$:

$$E = \sum_{i=1}^{\infty} [\{P_i - (s + tV_i)\} \cdot \gamma_i]^2 \tag{23}$$

The unknowns s, t which minimize the evaluation function E are determined based on the theory of the least squares method from the following equation (24) by solving dualistic simultaneous equations;

$$\frac{\partial E}{\partial s} = 0, \frac{\partial E}{\partial t} = 0$$

$$\binom{s}{t} = F^{-1} \begin{pmatrix} \sum_{i=1}^{\infty} P_i \gamma_i^2 \\ \sum_{i=1}^{\infty} P_i V_i \gamma_i^2 \end{pmatrix} \tag{24}$$

where $$F = \begin{pmatrix} \sum_{i=1}^{\infty} \gamma_i^2 & \sum_{i=1}^{\infty} V_i \gamma_i^2 \\ \sum_{i=1}^{\infty} V_i \gamma_i^2 & \sum_{i=1}^{\infty} V_i^2 \gamma_i^2 \end{pmatrix}$$

Here, by setting the weight $\gamma_i$ for the data as shown in the aforesaid equation (4) exactly like the first embodiment, elements of the matrix on the right side of the above equation (24) are expressed by:

$$\left.\begin{aligned} G_1 &= \sum_{i=1}^{\infty} \gamma_i^2 = \frac{1}{1 - \epsilon^2} \\ G_2 &= \sum_{i=1}^{\infty} V_i \gamma_i^2 \\ G_3 &= \sum_{i=1}^{\infty} V_i^2 \gamma_i^2 \\ H_1 &= \sum_{i=1}^{\infty} P_i \gamma_i^2 \\ H_2 &= \sum_{i=1}^{\infty} P_i V_i \gamma_i^2 \end{aligned}\right\} \tag{25}$$

These elements, i.e., parameters $G_1$–$G_3$ and $H_1$, $H_2$, are stored, as the information about the relation between the applied voltage and the oscillation energy amount, in the memory 7. When the new data $(V_i, P_i)$, i.e., the latest data $(V_1, P_1)$, is obtained, the calculator 6 takes in the parameters $G_1$–$G_3$ and $H_1$, $H_2$ from the memory 7 and updates the parameters $G_2$, $G_3$ and $H_1$, $H_2$ using gradual equations below, other than the constant $G_1$ ($G_1 = 1/(1-\epsilon^2)$). Use of such gradual equations shortens the calculation time required to update the information about the relation between the applied voltage V and the oscillation energy amount P. The calculator 6 newly stores the updated information in the memory 7.

$$\left. \begin{array}{l} G_2 = V_1 + \epsilon^2 G_2 \\ G_3 = V_1^2 + \epsilon^2 G_3 \\ H_1 = P_1 + \epsilon^2 H_1 \\ H_2 = P_1 V_1 + \epsilon^2 H_2 \end{array} \right\} \quad (26)$$

Thus, by updating $G_2$, $G_3$ and $H_1$, $H_2$ sequentially by the equation (26) per unit number of pulses or unit time and calculating the equation (24) to determine the unknowns s, t, the relative equation (equation (22)) between the applied voltage V and the oscillation energy amount P can be updated to determine the applied voltage V, corresponding to the oscillation energy amount P of the pulse to be next irradiated, using the equation (22).

Figure 8B:
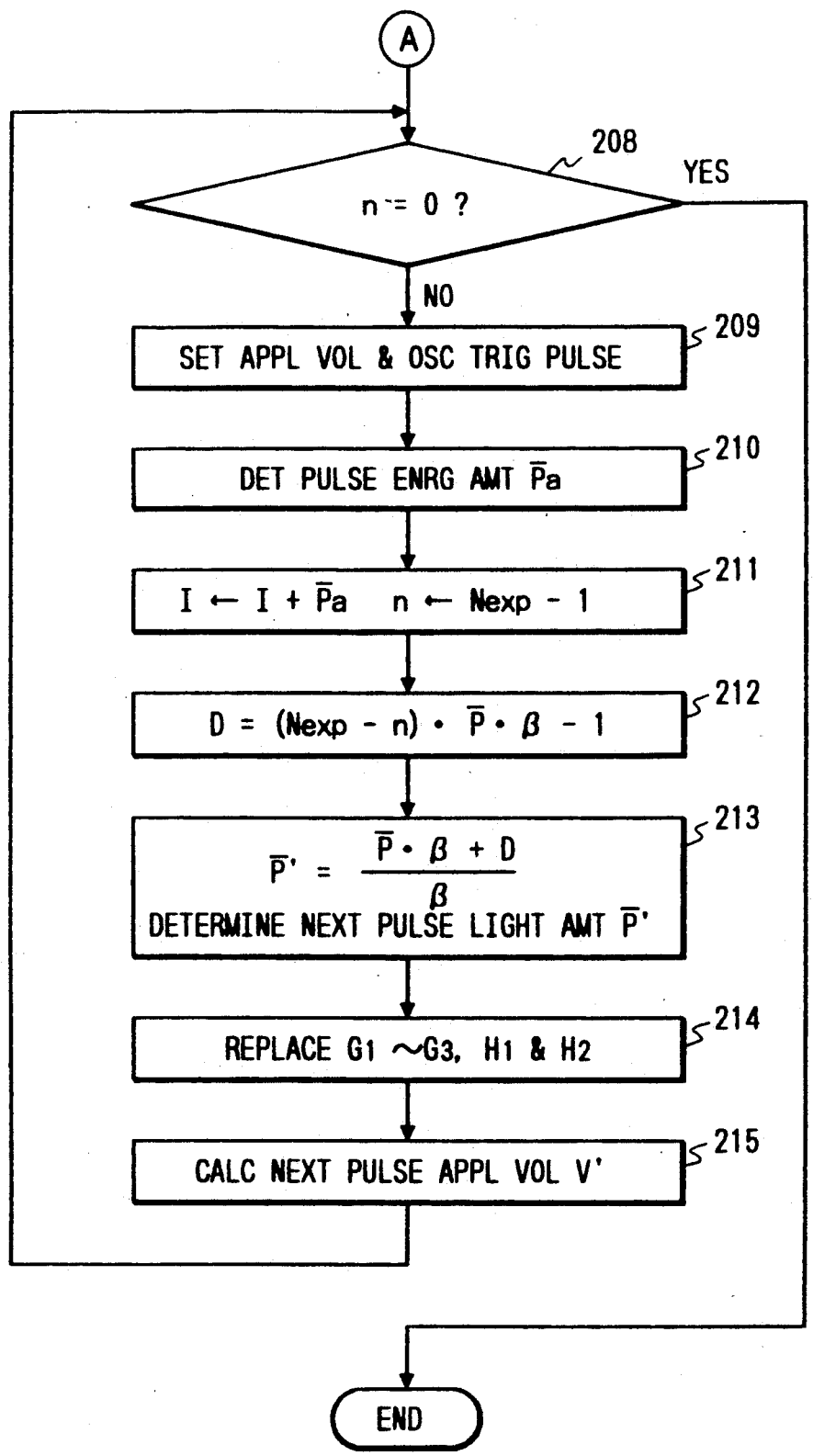

Operation of this embodiment will be described below with reference to FIG. 8. FIG. 8 is a schematic flowchart showing one example of operation of this embodiment. In a step 200, the calculator 6 first determines whether or not the parameters $G_1$–$G_3$ and $H_1$, $H_2$ are to be initialized. If the parameters $G_1$–$G_3$ and $H_1$, $H_2$ are sufficiently reliable, then the control goes to a step 203. On the other hand, if initialization is required, for example, if the pulse laser light source 1 is in a pumping state, or its oscillation is kept stopped for a long time, or gas replacement of an active medium within the chamber has been just finished, then the control goes to a step 201. In the step 201, while changing the applied voltage V to several different values within a predetermined range to be used (i.e., such a range as where the equation (22) can be well approximated by a linear function), the light amount per pulse oscillated at each voltage value is inputted from the light amount monitoring portion 5'. Afterward, in a step 202, based on the data ($V_i$, $P_i$) obtained in the step 201, the calculator 6 calculates the parameters $G_1$–$G_3$ and $H_1$, $H_2$ from the equation (26) and stores them in the memory 7.

In the next step 203, the calculator 6 receives the target total light amount S entered from the I/O device 8, as well as the exposure amount control accuracy A, the variations ($\Delta \bar{P}/\bar{P}$) in the average exposure energy between pulses, the maximum applied voltage Vmax and the pulse number Nsp necessary for smoothing the interference pattern from the memory 7. Of course, the variations ($\Delta \bar{P}/\bar{P}$) may be a value derived from the actual data ($V_i$, $P_i$) obtained in the above step 201 like the first embodiment. Then, based on the various data inputted in the step 203, the calculator 6 calculates the light reduction coefficient $\beta$ of the light reducing portion 15 (or the average light amount value $\bar{P}\cdot\beta$), i.e., the light reduction coefficient of the selected filter of the rotary turret plate 16, as well as the exposure pulse number Nexp, the pulse number Nvib during the half period of the vibrating mirror and the integer m under the light reduction coefficient of the selected filter (step 204). Subsequently, in a step 205, the rotary turret plate 16 is revolved to set the light reduction coefficient of the light reducing portion to $\beta$. Further, a step 206 calculates the applied voltage V used for obtaining the average exposure energy P from the equation (22). Here, it is desirable that the average exposure energy $\bar{P}$ is set not larger than a value $(1 - \Delta \bar{P}/\bar{P})$ time as many as the exposure energy $\bar{P}$max (maximum value) oscillated from the pulse laser light source 1 at the maximum applied voltage Vmax.

Next, in a step 207, the pulse counter n and the total light amount I are set to Nexp and zero (0), respectively. In a subsequent step 208, the main control system 9 determines whether or not the pulse counter n is zero. If not zero, the control goes to a next step 209. In the step 209, the applied voltage control portion 11 sets the applied voltage of the pulse laser light source 1 and, thereafter the trigger control portion 10 sends a trigger pulse to the pulse laser light source 1 for emitting a pulse beam of one pulse. In a next step 210, a value $\bar{P}a$ corresponding to the actual light amount of the pulse beam oscillated by the light receiving element 4' is detected and sent to the calculator 6 via the light amount monitoring portion 5'. Then, in a step 211, the calculator 6 calculates the total light amount I, sets the total light amount as $I = I + \bar{P}a$, and further sets the pulse counter to (Nexp − 1).

A next step 212 determines the target total light amount which will be applied by using the average light amount value $\bar{P}\cdot\beta$ determined in the step 204 from the following equation (27), and then a differential D between the resulting target total light amount and the actual total light amount I determined by the calculator 6.

$$D = (Nexp - n) \cdot \bar{P} \cdot \beta - I \quad (27)$$

Subsequently, a step 213 determines the light amount $\bar{P}'$ of the pulse beam to be next irradiated from the equation (28) below by correcting, based on the differential D, the average light amount value $\bar{P}\cdot\beta$ calculated in the step 204:

$$\bar{P}' = \frac{\bar{P}\cdot\beta + D}{\beta} \quad (28)$$

In a next step 214, based on the data of the preceding pulse, i.e., the applied voltage V provided to the pulse laser light source 1 in the step 209 and the light amount $\bar{P}a$ of one pulse detected in the step 210, the calculator 6 replaces the parameters $G_1$–$C_3$ and $H_1$, $H_2$ with new ones from the equation (26), which are stored in the memory 7. In a subsequent step 215, the calculator 6 calculates the applied voltage corresponding to the aforesaid light amount $\bar{P}'$ from the equation (22), and calculates the applied voltage $V_2$ corresponding to the first pulse energy amount $P_2$ from the equation (22), followed by returning to the step 208. In the step 208, like the above-stated operation, it is determined whether or not the pulse counter n is zero. If not zero, then the control goes to the step 209 for executing the same operation as mentioned above in the steps 209–215, followed by returning to the step 208 again. Thus, the steps 209–215 will be repeated until the pulse counter n becomes zero and, at the time the pulse counter n has become zero, the operation of exposure is brought into an end.

Figure 9:
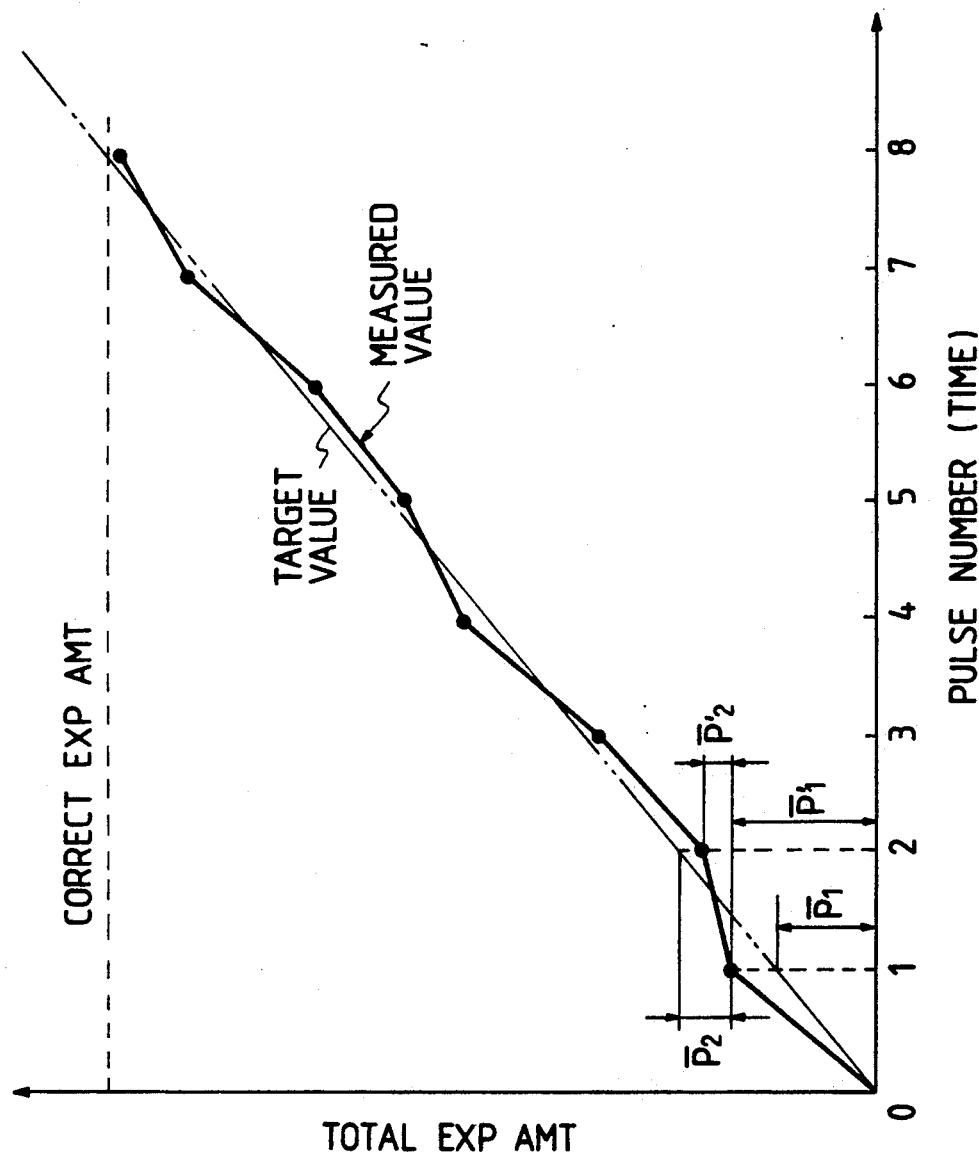
FIG. 9 is a graph showing the process of exposure amount control according to the second embodiment shown in FIG. 4.

Next, the process of exposure amount control in the apparatus of this embodiment will be described with reference to FIG. 9. FIG. 9 is a graph showing the relation between the number of pulses and the total exposure amount during exposure of one shot. The graph represents the case where the exposure is completed with 8 pulses. For the sake of simpler explanation, the light reduction coefficient $\beta$ of the light reducing portion 15 is assumed to be set to 1.

In FIG. 9, a two-dot-chain linear line represents a target value of the total exposure amount which will be applied using the pulse beam of the average light amount value $\bar{P} \cdot \beta$ determined in the step 204. In this embodiment of the present invention, therefore, the light amount is adjusted for each of the second and subsequent pulses so that the exposure amount control proceeds along the linear line representing the target value.

Assuming that the first pulse beam is emitted with the exposure amount $\bar{P}_1$ as a target value and the exposure amount actually detected after emission is $\bar{P}_1'$, the second pulse beam is emitted by setting its light amount equal to a difference $(2\bar{P}_1 - \bar{P}_1') = \bar{P}_2$ between the target exposure amount $2\bar{P}_1$ and th actual measured value $\bar{P}_1'$. At this time, the applied voltage control portion 11 is required to provide the applied voltage depending on the above light amount $\bar{P}_2$ to the pulse laser light source 1. Likewise, if the measured light amount value of the second pulse beam is $\bar{P}_2'$, the third pulse beam is emitted by setting its light amount to $(3\bar{P}_1 - \bar{P}_1' - \bar{P}_2') = \bar{P}_3$.

Accordingly, by repeating the above operation, the exposure is completed with the 8th pulse under a condition that a deviation from the two-dot-chain target line is kept small. With that process, it is apparent that the final exposure amount control accuracy (i.e., variation of the measured value with respect to the correct exposure amount) is given by a light amount error (variation) of the 8th pulse beam.

As explained above, in the second embodiment of the present invention, when carrying out the exposure of one shot by a plurality of pulse beams, the light amount of the (i+1)th pulse beam to be next irradiated is set based on the difference between the target value of the total exposure amount until the (i+1)th pulse beam and the past total exposure amount (until i-th pulse beam). In the case where there is some tendency in variations between pulses, however, a new target value may be set by averaging each ratio of the target value per unit number of pulses to the measured value per unit number of pulses for a plurality of past pulses, and dividing the target value by the resulting average value of the ratios.

The second embodiment has been explained in connection with the case where the pulse energy oscillated from the illumination light source for exposure is in the form of a coherent laser beam. But, when the light source of the exposure apparatus emits an incoherent light beam, or it emits pulse energy such as electron rays other than light, there is no need of considering the problem related to reduction (smoothing) of the interference pulse. Therefore, the process can be arranged so as to determine the number of pulses (corresponding to the pulse number Ne in this embodiment) necessary least to control the variations in the actual total exposure amount, which is applied to the wafer W by irradiation of plural pulse beams, with the desired exposure amount control accuracy for the correct exposure amount as a target, based on a fluctuation range of the pulse energy per pulse and the exposure amount control accuracy, and then to set a target value of the pulse energy per pulse based on the determined pulse number and the optimum exposure amount. In other words, since the error of the final total exposure amount relative to the correct exposure amount is determined by the light amount error of the final pulse beam, the process is just required to determine the pulse number following the equation (15) such that the variation of the final pulse falls within an allowable error of the exposure amount control accuracy, and to set the average energy amount per pulse following the equation (16).

Further, the operation that the applied voltage control for the pulse laser light source 1 is effective (required) in the exposure apparatus (FIG. 4) of this embodiment includes exposure of the wafer and collection of data (step 201 in FIG. 8) for obtaining the information about the relation between the applied voltage and the exposure energy. Usually, oscillation of the pulse laser light source 1 in the exposure apparatus is also required in measuring a distance between a detection reference position (position of mark detection center) of an off-axis type alignment system, for example, which is provided separately from the projection lens to exclusively detect only an alignment mark on the wafer W, and a projected position (exposure position) of projection image of the reticle, i.e., in measurement of the so-called baseline. The measurement operation of the baseline carried out in the exposure apparatus using a pulse laser as a light source is disclosed in U.S. Pat. No. 4,853,745 and thus will not here described in detail. To put it briefly, illumination light transmitted from the pulse laser light beam via a plurality of reflecting members (or optical fibers) illuminates a reference mark provided on a wafer stage from below (i.e., from the interior of the wafer stage, thereby detecting a position of the wafer stage when the alignment mark R on the reticle R and a projection image of the reference mark on the wafer stage are coincident with each other. The alignment system is further used to detect a position of the wafer stage when the position of the mark detection center of the alignment system and the reference mark on the wafer stage are coincident with each other. Then, the distance between the two detected positions is defined as a baseline. In such measurement of the baseline, therefore, it is not necessarily required to perform the applied voltage control for the pulse laser light source 1. It is thus desirable that an oscillation mode of the pulse laser light source 1 may be switched over between an applied voltage control mode and an energy amount constant mode (or applied voltage constant mode) to use the energy amount constant mode in the operation except for exposure of the wafer and collection of data in the step 201.

In the above first and second embodiments of the present invention, the information about the relation between the applied voltage (or the charged voltage) and the oscillation energy amount (or the dose amount) is expressed in the form of matrix elements as shown in the equations (5) or (25). In place of those matrix elements, i.e., the parameters $C_1$-$C_5$, $D_1$-$D_3$ or $G_1$-$G_3$, $H_1$, $H_2$, however, ratios between the unknowns a–c or s, t derived at the time of initialization of the aforesaid relation (step 102 or 202) and the unknowns a'–c' or s', t' at the time of updating (step 108 or 214) may be used as the aforesaid information. Alternatively, a correction factor of the applied voltage necessary for obtaining the predetermined pulse energy relative to the applied voltage at the time of initialization of the aforesaid relation may be expressed as a function of the pulse energy, followed by sequentially updating the function.

Moreover, the above first and second embodiments of the present invention have been explained as updating, per pulse, the information about the relation between the applied voltage (or the charged voltage) and the oscillation energy amount (or the dose amount). In the case where one pulse cannot suffice the time required for calculation, the information may be updated per unit number of pulses (e.g., per 5 pulses) or certain period of time. At this time, the updating interval of the information is desirably set to a sufficiently short time in comparison with the time during which the aforesaid relation between the two parameters may be changed. In that case, it is estimated that a method (thinning-out technique) of using only data per unit number of pulses or certain period of time and discarding other data requires a least amount of arithmetic operations and is most effective.

According to the present invention, as described above, the applied voltage (or the charged voltage) and the oscillation energy amount (or the dose amount) are appropriately inputted per unit number of pulses or certain period of time, and the relative equation therebetween is updated through arithmetic operations. Thus, since the relative equation is sequentially updated depending on change over time in the relation between the applied voltage and the oscillation energy amount, the energy amount control can be always performed satisfactorily.

Also, even in the case where the energy generating source is a pulse laser and partial gas replacement, etc. of the laser is required with the exposure operation repeated, the aforesaid relative equation can be updated following change over time in the relation between the applied voltage and the oscillation energy amount (i.e., reduction in the output power due to deterioration of a gas mixture within the chamber). In exposure apparatus, particularly, the present invention is advantageous in smoothing the final interference pattern (i.e., making illuminance uniform) in an essentially perfect manner. It is thus possible to implement exposure of one shot with the necessary least number of pulses, while optimizing the exposure amount and smoothing the interference pattern with higher accuracy than prior art, notwithstanding a reduction in the output power of the pulse laser light source. As a result, the production rate can be increased.

Figure 10:
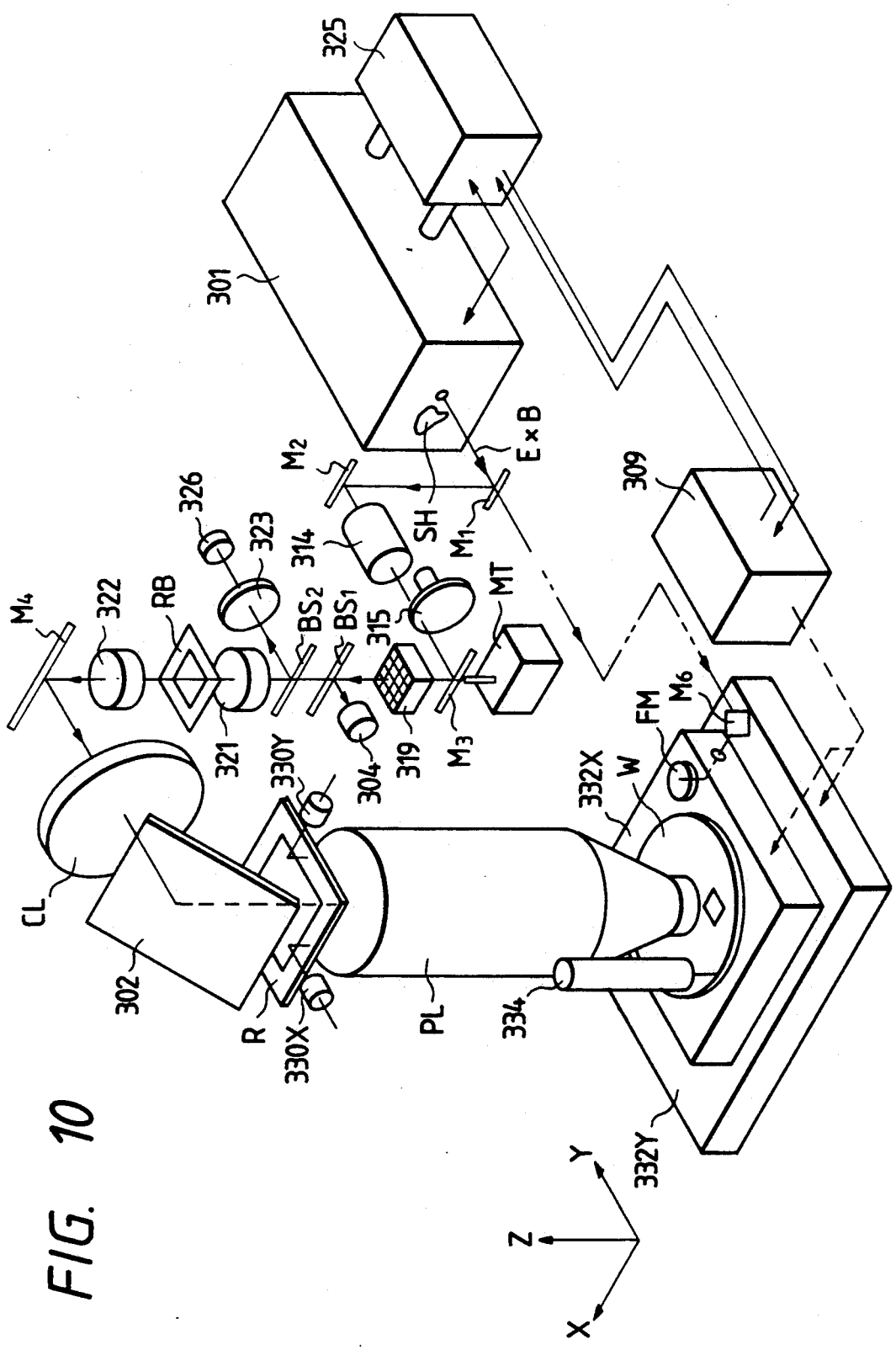
FIG. 10 is a perspective view showing the schematic configuration of an exposure apparatus according to another embodiment of the present invention.
Figure 11:
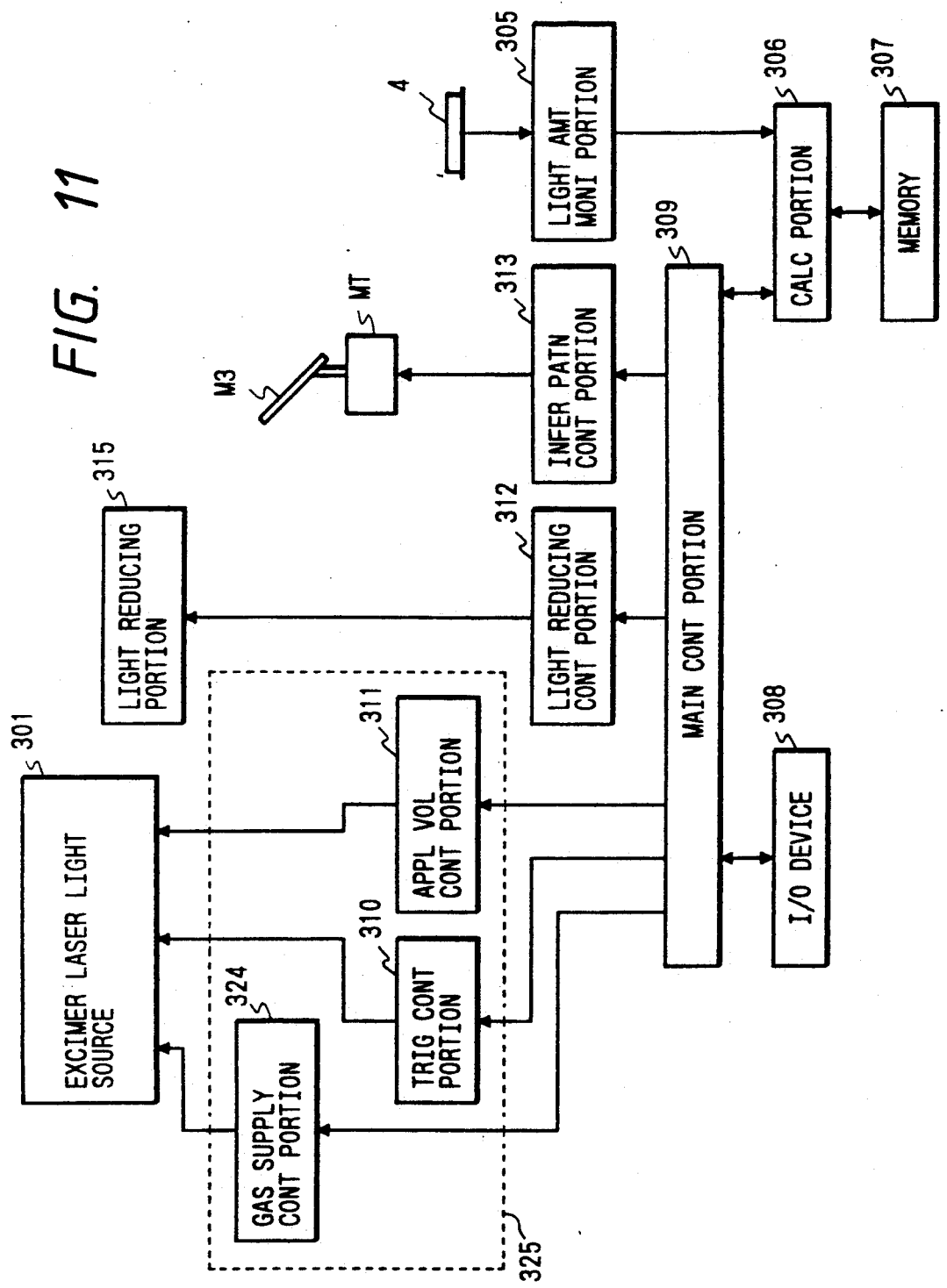
FIG. 11 is a block diagram of a control system of the exposure apparatus shown in FIG. 10.

FIGS. 10 and 11 show another embodiment of the present invention in which part of the above second embodiment is modified. Since both basic configuration and operation of the apparatus are similar to those in the second embodiment, the following explanation will be mainly directed to differences therebetween.

The PGR and HI operations for an excimer laser light source 301 are performed by a control system 325. In this embodiment, however, the control system 325 is designed to control the excimer laser light source 301 not solely, but cooperatively with an exposure apparatus body (main control system 309). As shown in FIG. 11, a trigger control portion 310 delivers an external trigger pulse to the excimer laser light source 301 and controls its oscillation (number of pulses, oscillation interval, etc.) after a preset charging time necessary for the excimer laser light source 301 has elapsed. An applied voltage control portion 311 serves to control high discharge voltage (corresponding to applied voltage) of the excimer laser light source 301. Thus, the applied voltage control portion 311 changes the applied voltage in response to a command from the main control system 309 for finely adjusting the energy amount of the pulse beam to be next irradiated. A gas supply control portion 324 serves to control implementation of the PGR and HI operations for the excimer laser light source 301 in cooperation with the exposure apparatus body as mentioned above. The trigger control portion 310, the applied voltage control portion 311 and the gas supply control portion 324 jointly constitute the control system 325 (FIG. 10). The control system 325 also makes control such as for stabilizing wavelength of the excimer laser light source 301.

A laser beam ExB emitted from the excimer laser light source 301 is led via a movable mirror $M_1$ and a fixed mirror $M_2$ to enter a beam expander 314 in combination of two sets of (concave and convex) cylindrical lenses so that the beam cross section is formed into substantially a square shape.

The beam emerging from the beam expander 34 enters a light reducing portion 315 where a light amount (energy) of the beam is continuously or stepwisely attentuated between 0% (perfect transmission) and 100% (perfect cut-off). As shown in FIG. 11, a light reduction coefficient (or transmissivity) of the light reducing portion 315 is controlled to a predetermined value by the light reducing control portion 312.

The light reducing portion 315 suitable for use with this embodiment can be constituted by using the above-stated one shown in FIG. 5.

A substantially parallel beam, of which light amount is attenuated in the light reducing portion 315 at a predetermined light reduction coefficient, is reflected by a swing mirror $M_3$ to become a beam vibrating one-dimensionally (or two-dimensionally) through a small angle, followed by entering a fly eye's lens 319. The swing mirror $M_3$ (such as a galvano-mirror or polygon mirror) is vibrated one-dimensionally (or two-dimensionally) within a predetermined angle by a drive portion MT comprising an actuator (such as a piezo element) to change an incident angle of the laser beam upon the fly eye's lens 319 per pulse, thereby smoothing the interference pattern.

A plurality of beams comprising the respective spot lights, produced on the emergent side of the fly eye's lens 319, pass through beam splitters $BS_1$, $BS_2$ and are superposed by a condenser lens system 321 on a reticle blind RB with light intensity distribution almost uniform. The laser beam having passed through the reticle blind RB is led via a lens system 322, a fixed mirror $M_4$, a condenser lens CL and a fixed mirror 302 to illuminate a circuit pattern area of the reticle R with illuminance distribution almost uniform. The reticle blind RB is in conjugate relation to the reticle R through the lens system 322 and the condenser lens CL. The reticle R is positioned by dedicated reticle alignment systems 330X, 330Y in the X, Y and $\theta$ directions with respect to the apparatus body.

An image of a circuit pattern on the reticle R is transferred onto a resist layer of the wafer W is transferred onto a wafer W, on which a resist layer is formed, by the projection lens PL with a predetermined exposure amount. At this time, a plurality of spot lights (two-dimensional light source image) produced on the emergent side of the fly eye's lens 319 are refocused in a pupil (entrance pupil) of the projection lens PL which is tele-centric at least on the image (wafer) side, thereby constituting the so-called Keller's illumination system. The wafer W is placed on an X-stage 332X movable in the X-direction on a Y-stage 332 which is in turn movable in the Y-direction on a base.

On the X-stage 332X, there is provided a reference mark plate FM having a transmission type reference slit substantially at the same height as the wafer W. A mirror (not shown) fixed to the X-stage 332X is disposed below the reference mark plate FM. The reference mark plate FM is arranged such that when the moving mirror $M_1$ is retracted from the illustrated position, the reference mark plate FM receives the pulse beam from the excimer laser light source 301 via a plurality of mirrors (not shown) and a mirror $M_6$ fixed onto the Y-stage 332Y through the underside thereof. The excimer laser beam incident upon the mirror $M_6$ is substantially parallel flux propagating in parallel to the Y-axis and reflected by the mirror $M_6$ at a right angle in the X-direction, following which the beam is reflected vertically upward by a mirror disposed below the reference mark plate FM. Accordingly, the excimer laser beam is always incident upon the underside of the reference mark plate FM regardless of how the X-stage 332X and the Y-stage 332Y may be moved.

Alignment (mark detection) of the wafer W is carried out by an off-axis type wafer alignment system 334. The wafer alignment system 334 photoelectrically detects an alignment mark at a particular position on the wafer W by using illumination light (uniform illumination or spot light) in such a range of wavelength as not exposing the resist layer on the wafer W. Although the wafer alignment system 334 is fixed in a certain positional relation with respect to the projection lens PL, the relative positional relation between the detection center of a mark (index or spot light in the alignment system) on the wafer W and the center of projection image of a circuit pattern on the reticle R, i.e., the so-called baseline, is changed to some extent for each replacement of the reticle R. The reference mark plate FM is therefore used to permit measurement of the baseline. To this end, a pulse beam from an exit slit of the reference mark plate FM is partially branched by the beam splitter $BS_2$ disposed in an optical path of an illumination optical system, so that the branched beam is received by a photoelectric element (such as photomultiplier) 326 via a lens system 323. A light receiving surface of the photoelectric element 326 is arranged substantially in conjugate relation with the pupil (entrance or exit pupil) of the projection lens PL through the lens system CL, 321, 323, etc.

In the apparatus thus arranged, a partition of a thermal chamber for housing the exposure apparatus (stepper) body is present between the moving mirror $M_1$ and the excimer laser light source 301, with the laser light source 301 installed outside the thermal chamber. The stepper body is supervised and controlled by a main control system 309 to implement movement of the XY-stages 332X, 332Y, positioning of the reticle R by the reticle alignment systems 330X, 330Y, position detection and operation of the wafer W by the wafer alignment system 334, setting of the reticle blind RB, a series of check operations of the relative positional relation using the photoelectric element 326 and the reference mark plate FM, operation of exposure amount control using a photoelectric element 304 (such as a pyroelectric type power meter or PIN photodiode) to receive part of the pulse beam reflected by the beam splitter $BS_1$, operation of smoothing the interference pattern produced by vibration of the vibrating mirror $M_3$, etc. Positions of the XY-stages 332X, 332Y are successively measured as coordinate values by a not-shown laser interference type length gauge (interferometer), and the measured coordinate values are also inputted to the main control system 309 for measurement of various positions.

A photoelectric signal outputted from a light receiving element 304 comprising a PIN photodiode or the like is inputted to a light amount monitoring portion 305 for conversion into the actual light amount per pulse. The energy amount measured by the light amount monitoring portion 305 is sent to a calculator 306 which successively integrates the energy amount per pulse. In the calculator 306, the actual measured value (light amount) becomes base data used for control of the exposure amount, updating of information about the relation between the applied voltage of the excimer laser light source 301 and the energy amount of the exposure pulse (or the actual energy amount applied to the wafer W, i.e., the so-called dose amount), as well as control of oscillation per shot of a trigger pulse oscillated from the trigger control portion 310.

As to the light receiving element 304, the relation between the actual light amount of the laser beam irradiated to the wafer W and sensitivity of the light receiving element 304 is determined in advance by using a power meter and stored in a memory 307 with both the parameters being made associated with each other under a predetermined relation. Alternatively, the light amount monitoring portion 305 may successively integrate the light amount per pulse, followed by outputting the total light amount and the light amount per pulse to the calculator 306.

As with the foregoing embodiments, the calculator 306 includes means for updating the information about the relation between the applied voltage (or charged voltage) and the exposure pulse energy (or dose amount), and means for determining the applied voltage corresponding to the energy amount of the exposure pulse to be next irradiated. For example, when the above information is updated during exposure of one wafer, or per unit number of pulses or unit time, the calculator 306 previously takes in the applied voltages developed at the time of oscillation of plural pulses until the last pulse and the energy amount of the exposure pulse detected by the light amount monitoring portion 305, for updating the above information through predetermined arithmetic processing (described later in detail) based on those data and storing the updated information in the memory 307. Even during exposure of one shot, therefore, the above information can be updated without interrupting the exposure.

If the wafer W is placed on the XY-stages at the time of obtaining the above information when the stepper is started up, restarting the oscillation after the pulse oscillation has been kept stopped for a long time, or updating the above information after the PGR or HI operation has been implemented, it is required to move the XY-stages, for example, to their predetermined retracted positions prior to the exposure operation so that the wafer W will not be exposed, oscillate the excimer laser plural times while changing the applied voltage, and calculate or update the above information from the resulting relation between the applied voltage and the energy amount of the exposure pulse under that applied voltage.

Further, based on the total energy amount resulted from successively integrating the energy amount of the exposure pulse per pulse detected by the light amount monitoring portion 305, the calculator 306 determines the energy amount of the pulse beam to be next irradiated in accordance with a predetermined exposure amount control logic (described later). Afterward, based on the updated information between the applied voltage and the energy amount of the exposure pulse, the calculator 306 calculates the applied voltage corresponding to the energy amount of the pulse beam to be next irradiated, followed by sending it to the main control system 309. Note that the exposure amount control logic is substantially the same as that in the foregoing second embodiment.

The gas supply control portion 324 generates signals (demand signal LA and inhibit signal LB described later) indicative of whether the PGR or HI operation is required or not, depending on an oscillation state of the excimer laser light source 301, and implements the PGR or HI operation after detecting the time at which the PGR or HI operation is to be performed, based on the above two signals generated and other two signals inputted from the main control system 309.

One shot area on the wafer W is exposed with several tens or more pulses in view of smoothing of the interference pattern and exposure amount control accuracy. Accordingly, if the PGR or HI operation is started during exposure of one shot, the relation between the applied voltage (or charged voltage) and the energy amount of the exposure pulse is heavily fluctuated during the PGR or HI operation even if the applied voltage of the excimer laser light source 301 is adjusted per pulse in accordance with the exposure amount control logic as explained in connection with the above second embodiment. Because it is difficult to update the equation expressing the above relation in good following relation to the fluctuations, the desired exposure amount control accuracy cannot be achieved. Therefore, a manner of determining timing at which the PGR or HI operation in the apparatus of this embodiment, and exposure operation in the apparatus will be described with reference to FIGS. 12 to 15.

In this embodiment, the side of the excimer laser light source 301 (control system 325) and the side of the exposure apparatus body (main control system 309) each create signals corresponding to the need and non-need of the PGR and HI operations, i.e., signals demanding implementation of those operations and signals inhibiting implementation thereof. Based on these four signals in total, the timing to implement the PGR or HI operation is determined. Accordingly, there will be first explained the demand signal and the inhibit signal created by each of the control system 325 and the main control system 309.

Depending on the oscillation state of the excimer laser light source 301, the control system 325 always generates a signal LA for demanding implementation of the PGR or HI operation and a signal LB for inhibiting the implementation thereof. In this embodiment, each signal level of the signals LA, LB are changed from Hi to Lo or from Lo to Hi to inform a decision circuit (described later), which determines timing (point in time) to implement the PGR or HI operation, of that the need of implementing the operation is drawing near on the side of the excimer laser light source, or that the operation should be kept inhibited.

In the case where the oscillation mode of the excimer laser light source 301 is an energy amount constant mode, for example, the gas supply control portion 324 monitors the applied voltage provided to the excimer laser light source 301, and changes the signal level of the demand signal LA (from Lo to Hi in this embodiment) at the time the monitored value reaches a predetermined upper limit (e.g., a value slightly than the maximum applied voltage). As an alternative, it is also possible to count the number of oscillated pulses (the oscillation time) after the laser has been started up or the preceding PGR or HI operation has been implemented, and changes the signal level of the demand signal LA at the time the total pulse number (or total oscillation time) reaches a predetermined value (depending on oscillation conditions, etc.). Upon completion of the above operation, the gas supply control portion 324 changes the signal level of the demand signal LA from Hi to Lo.

Meanwhile, in the case where the oscillation mode of the excimer laser light source 301 is an applied voltage control mode, the gas supply control portion 324 monitors the output of a detector installed in a body of the excimer laser light source 301 for monitoring the laser power, and determines a relation (or an equation expressing the relation) between voltage applied to the excimer laser light source 301 and an energy amount of the pulse beam actually emitted under that applied voltage. At the time the relation (equation) is changed due to deterioration of interior gas, etc. and reaches some relation (value) serving as a predetermined judgment basis, the signal level of the demand signal LA is changed. As an alternative, the above relation (equation) may be updated sequentially, or per unit number of pulses or unit time.

Further, the control system 325 generates the signal LB to inhibit implementation of the PGR or HI operation for purpose of preventing the presence of excessive halogen gas within a laser chamber that may be caused after the operation. More specifically, in this embodiment, the gas supply control portion 324 monitors any one of the energy amount of the pulse beam oscillated under the predetermined applied voltage, the total number of pulses oscillated after the PGR or HI operation (or total oscillation time thereafter), and a gas concentration within the chamber, and holds the signal level of the inhibit signal LB at Hi until the monitored value reaches a predetermined value, thereby inhibiting implementation of the operation. Then, at the time the monitored value reaches a predetermined value while continuing the pulse oscillation, the signal level of the inhibit signal LB is changed from Hi to Lo to inform that the operation is released from an inhibited state.

Since the inhibit signal LB is to prevent the presence of excessive halogen gas, its signal level is normally held at Lo and can be turned to Hi only during the time immediately after implementation of the operation to elapse of a predetermined oscillation time. Alternatively, it is also possible to monitor all of the pulse energy amount, the total pulse number (or total oscillation time and the gas concentration, and change the signal level from Hi to Lo at the time any one or all of them reaches the predetermined value(s).

On the side of the exposure apparatus body, the main control system 309 always creates a signal SA for demanding implementation of the PGR or HI operation and a signal SB for inhibiting the implementation thereof, followed by outputting the signals SA, SB to the control system 325 (gas supply control portion 324). Specifically, the main control system 309 changes each signal level of the signals SA, SB inputted to the gas supply control portion 324 (decision circuit described later in detail), depending on each of an exposure state of the wafer W on the exposure apparatus body side, e.g., the relation (FIG. 2) between the applied voltage and the pulse energy amount on the reticle (or wafer) surface which relation determines the applied voltage, corresponding to the energy amount of the pulse beam to be next irradiated, in accordance with the exposure amount control logic, and an operating state in the exposure sequence on the exposure apparatus body side. Upon change in the signal level, the main control system 309 informs the gas supply control portion 324 of that the need of implementing the operation is drawing near on the exposure apparatus body side, or that the operation should be kept inhibited.

In the case where the oscillation mode of the excimer laser light source 301 is an applied voltage control mode, the main control system 309 monitors the energy amount of the pulse beam actually irradiated to the reticle surface (output of the light amount monitoring portion 305), and appropriately checks a relation (or an equation expressing the relation) between the applied voltage and the pulse energy amount on the reticle surface. Then, at the time the relation (equation) reaches a relation (equation) serving as a predetermined judgment basis, the signal level of the demand signal SA is changed from $L_0$ to $H_i$ in this embodiment.

Figure 12:
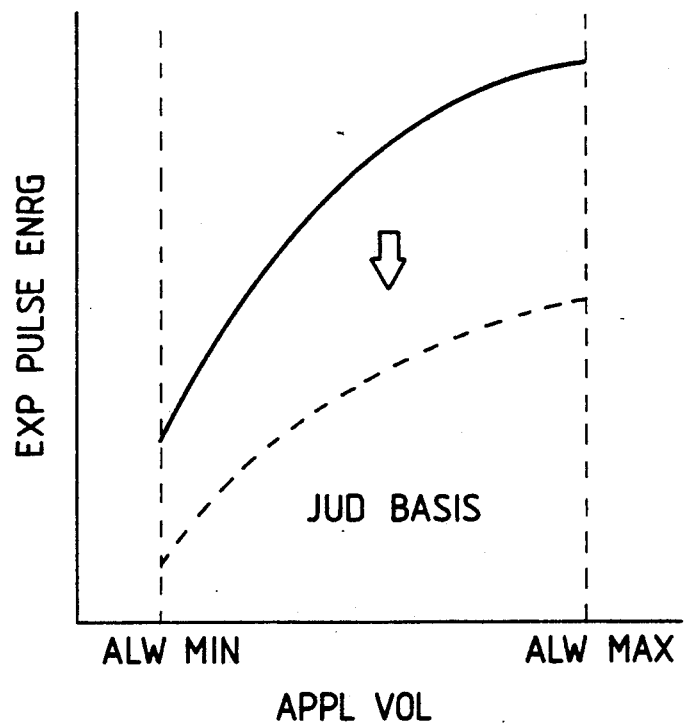
FIG. 12 is a graph for explaining a manner of creating a signal demanding implementation of partial gas replacement or gas injection on the exposure apparatus body side.

FIG. 12 is a graph showing one example of the relation between the applied voltage of the excimer laser light source 301 and the energy amount on the reticle (or wafer) surface of the pulse beam actually oscillated under that applied voltage. In FIG. 12, a solid line represents the relation immediately after the PGR or HI operation, and a dotted line represents the relation serving as the aforesaid judgment basis. As will be seen from FIG. 12, the relation represented by the solid line is gradually changed with deterioration of the internal gas and finally reach the relation (dotted line) of judgment basis, whereupon the main control system 309 changes the signal level. Upon completion of the above operation, the main control system 309 changes the signal level of the demand signal SA from Hi to Lo.

Further, in this embodiment, if the oscillation mode of the excimer laser light source 301 takes an applied voltage control mode only the time of exposing the wafer and collecting (initializing) the data to create or update the above relation (FIG. 2), the demand signal SA is outputted (that is, its signal level is changed from Lo to Hi) only when the oscillation mode is an applied voltage control mode and, particularly, the exposure is being carried out for the wafer W or the initialization has been finished. This is because, in the energy amount constant mode, the need or non-need of implementing the PGR or HI operation can be determined sufficiently only by the aforesaid demand signal LA without using the demand signal SA, or because the above relation (FIG. 2) is being created or updated during the initialization. In addition, from that reason, the main control system 309 is not required to always determined the above relation (FIG. 2) from the output of the light amount monitoring portion 305, but just required to, at the time of updating the above relation during exposure in accordance with the exposure amount control logic, judge whether or not the signal level of the demand signal SA should be changed based on the updated relation.

For purpose of preventing the PGR or HI operation from being started during exposure of one shot area, by way of example, the main control system 309 changes a level of the signal SB inputted to the gas supply control portion 324 to inhibit implementation of the PGR or HI operation, depending on an operating state in the exposure sequence on the side of the exposure apparatus body. In this embodiment, the signal level of the inhibit signal SB is set to Hi, for example, so that implementation of the PGR or HI operation is inhibited during the time not only the wafer is being exposed, but also the data to create or update the information about the relation (FIG. 2) between the applied voltage and the energy amount of the pulse beam irradiated to the reticle (or wafer) surface is being collected (initialized) in the applied voltage control mode in accordance with the exposure amount control logic. Then, at the time the exposure for one shot area or one wafer, or the initialization is completed, the signal level is changed from Hi to Lo. Upon start of the exposure or initialization, the signal level of the inhibit signal is changed from Lo to Hi.

Figure 13:
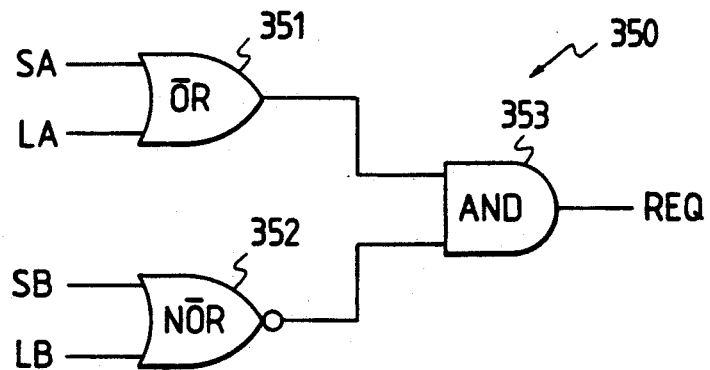
FIG. 13 is a block diagram showing one example of a decision circuit for determining the timing (point in time) at which the partial gas replacement or gas injection is to be implemented.

The above four signals LA, LB, SA, SB are inputted to the gas supply control portion 324, that is, a decision circuit 350 provided within the gas supply control portion 324 in this embodiment, which determines whether or not to implement the PGR or HI operation. At the time the implementation of the operation is determined, i.e., levels of some of those signals are changed, the PGR or HI operation is implemented. FIG. 13 is a block diagram showing one example of the decision circuit 350 for determining the timing (point in time) at which the PGR or HI operation is to be implemented. The demand signals LA, SA are inputted to an OR circuit 351, whereas the inhibit signals LB, SB are inputted to a NOR circuit 352. In the decision circuit 350, therefore, only when the signal level of at least one of the demand signals LA, SA turns to Hi and both the signal levels of the inhibit signals LB, SB turn to Lo, a signal REQ. from an AND circuit 353 is changed in its level from Lo to Hi, whereupon the gas supply control portion 324 starts the PGR or HI operation. Thus, at the time the level of the signal REQ. is changed from Lo to Hi, a shutter SH of the excimer laser light source 1 is driven to close and the gas supply control portion 324 starts the above operation, such as partial gas replacement or gas injection, upon closing of the shutter SH.

Figure 14:
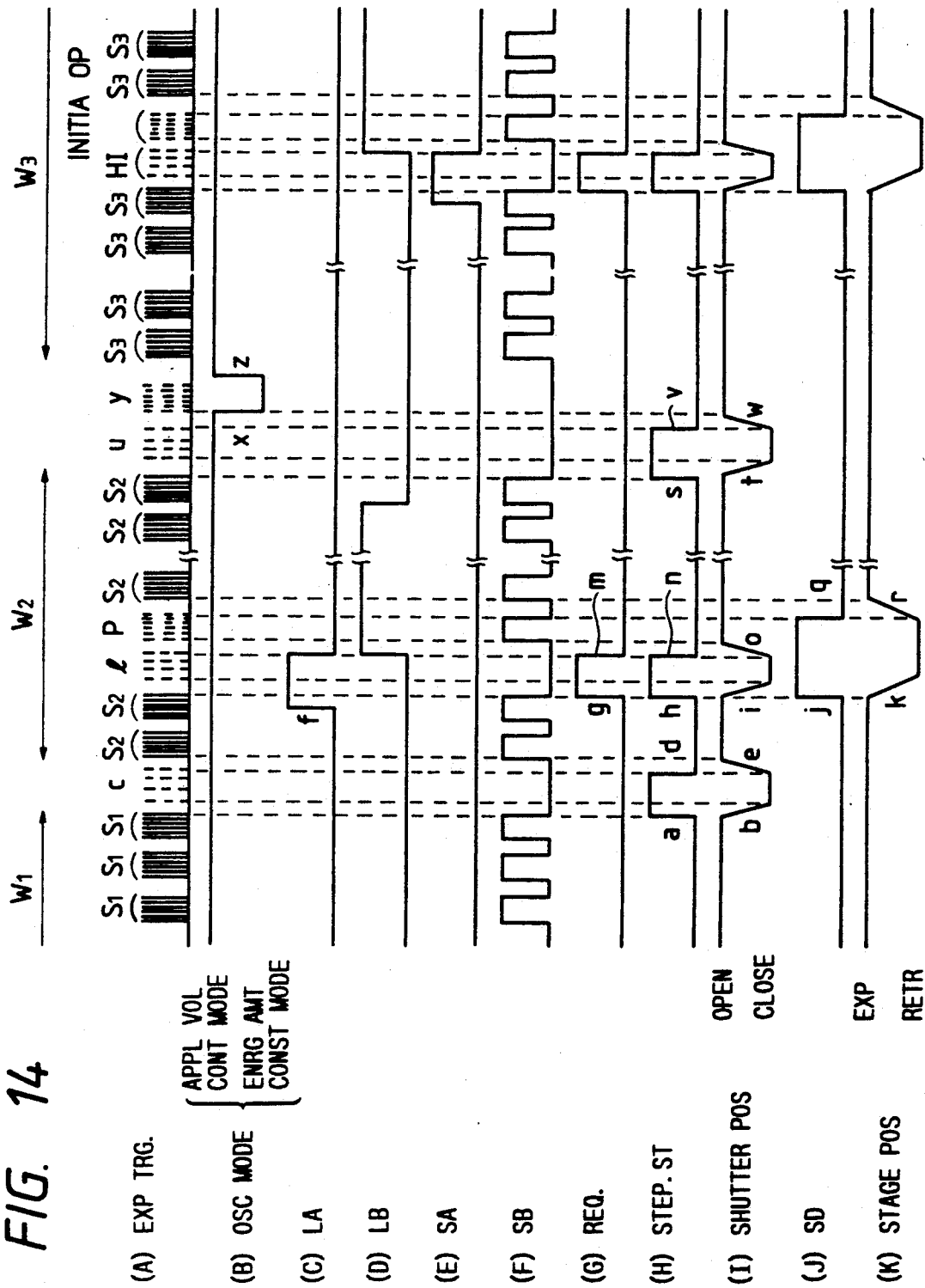
FIG. 14 is a time chart showing one example of operation of the exposure apparatus shown in FIG. 10.

Next, operation of the exposure apparatus according to this embodiment will be described with reference to FIG. 14. FIG. 14 shows one example of a time chart of the operation in this embodiment. Respective functions of those signals which have not yet been mentioned will be first explained.

(1) Signal EXT. TRG. (EXTERNAL TRIGGER)

This is a trigger signal sent from the exposure apparatus body to the excimer laser light source 301 for oscillation of the laser beam. The laser light side oscillates the laser beam upon detection of this signal. One trigger signal corresponds to laser beam oscillation of one pulse.

(2) Signal STEP. ST. (STEPPER STATUS)

This is a level signal sent from the exposure apparatus body to the excimer laser light source 301 for commanding an operation mode. When this signal is at Lo, the excimer laser light source 301 emits a laser beam one pulse by one pulse in synchronism with the EXT. TRG. signal from the exposure apparatus body. When this signal is at Hi, there are two operation modes of the excimer laser. When this signal is changed from Lo to Hi during the time the signal REQ. from the decision circuit 350 is held at Lo, i.e., the command to implement the PGR or HI operation is not sent to the excimer laser light source 301, the excimer laser light source 301 closes the shutter SH at an outlet of the laser beam and produces self-oscillation at appropriate low frequency to lock the exposure pulse energy, absolute wavelength, etc. Also, when this signal is changed from Lo to Hi with the signal REQ. being at Hi, the excimer laser light source 301 closes the shutter SH and implements the PGR or HI operation.

If the wafer W is present below the projection lens PL at the time of implementing initialization (or the PGR, HI operation), the main control system 9 changes a signal SD, applied to a stage controller (not shown), from Lo to Hi so that the XY-stages 332X, 332Y are moved to the predetermined retracted positions.

In FIG. 14, (A), (C)-(H) and (J) represent states of the signal EXT. TRG., the demand signal LA, the inhibit signal LB, the demand signal SA, the inhibit signal SB, the signal REQ., the signal STEP. ST. and the signal SD, respectively, and (B) represents the oscillation mode of the excimer laser light source 301. FIG. 14(I) represents a position state of the shutter SH of the excimer laser light source 301 and FIG. 14(K) represents a position state of the XY-stages 332X, 332Y. As will be seen from the inhibit signal SB shown in FIG. 14(F), this embodiment is arranged such that the PGR or HI operation will not be implemented at least during exposure of one shot area. Further, this sequence will be explained in connection with the case of implementing only the HI operation.

In FIG. 14(H), the periods in which the signal STEP. ST. is held at Lo stand for normal implementation of the wafer exposure, and the periods in which it is held at Hi stand for a state that operation in which the exposure apparatus body sends no emission triggers to the excimer laser light source 301 during several or more seconds, for example, such operation as wafer exposure, reticle alignment by the reticle alignment systems 330X, 330Y, or wafer alignment by the wafer alignment systems 334, is being implemented. During the periods in which the signal STEP. ST. is held at Lo, the exposure is repeated on one wafer for each shot area using the step and repeat technique. Under this condition, each set $S_1$, $S_2$, $S_3$ of trigger pulse train of the signal EXT. TRG. shown in FIG. 14(A) corresponds to exposure of one shot.

As shown in FIG. 14(A), when the exposure for a first wafer $W_1$ is completed, the exposure apparatus body (main control system 309) changes the signal STEP. ST. from Lo to Hi (a). Upon recognizing such a signal level change, the excimer laser light source (control system 325) starts closing the shutter SH (b) and, at the time the shutter SH is perfectly closed, starts self-oscillation at low frequency less than several Hz (c), thereby locking the absolute wavelength, etc. (i.e., making feedback control). During the time the excimer laser light source is self-oscillating, the exposure apparatus body carries out the aforesaid operation in which no emission triggers are sent, followed by changing the signal STEP. ST. from Hi to Lo (d). Upon recognizing this signal level change, the excimer laser light source stops self-oscillation and then starts opening the shutter SH (e). At the time the shutter SH is perfectly opened, the exposure apparatus body outputs the set $S_2$ of trigger pulse train as the signal EXT. TRG. to start the exposure operation for a next wafer $W_2$. Each spacing between adjacent twos of the trigger pulse trains $S_1$, $S_2$, $S_3$ corresponds to stepping of the XY-stages 332X, 332Y.

Meanwhile, in asynchronism with the foregoing exposure sequence of the exposure apparatus body, it is required for the excimer laser light source 301 to implement the PGR or HI operation. Before starting the exposure of each shot area on the wafer, therefore, the exposure apparatus body checks a state of the signal REQ. shown in FIG. 14(G), and implements the exposure of next shot if the signal REQ. is at Lo. On the other hand, if the demand signal LA on the side of the excimer laser light source shown in FIG. 14(C) is changed from Lo to Hi during delivery of the trigger pulse train $S_2$, i.e., during exposure of a second shot area of the second wafer $W_2$ (f), the excimer laser light source starts the HI operation not in synchronism with the signal LA, but at the time the signal REQ. is changed from Lo to Hi, i.e., the exposure of the second shot area is completed (g). Note that when the demand signal LA is changed from Lo to Hi, the inhibit signal LB shown in FIG. 14(D) takes Lo, but the inhibit signal SB shown in FIG. 14(F) takes Hi.

In this example, since the demand signal LA is changed from Lo to Hi during exposure of the second shot area, the exposure apparatus body checks the signal REQ. and recognizes its level being at Hi, after completing the exposure of the second shot area (before stepping the XY-stages 332X, 332Y to a third shot area). The sequence in the exposure apparatus body proceeds to interrupt the stepping toward the third shot area and changes the signal STEP. ST. from Lo to Hi (h). Upon change of the signal REQ. being from Lo to Hi, the excimer laser light source recognizes it as a start command of the HI operation, and starts closing the shutter SH in response to the signal STEP. ST. from the exposure apparatus body (i). At the same time, the exposure apparatus body also changes the signal SD from Lo Hi (j), thereby moving the XY-stages 332X, 332Y to the predetermined retracted positions (k). After perfect closing of the shutter SH, the excimer laser light source implements the HI operation while self-oscillating at proper frequency (e.g., higher frequency than that in the case of (c)) (l).

Afterward, at the time the HI (halogen gas injection) operation is completed, the excimer laser light source stops the self-oscillation and changes the signal REQ. from Hi to Lo (m). Upon recognizing this signal level change, the exposure apparatus body changes the signal STEP. ST. from Hi to Lo as a start command of initialization for the excimer laser light source (n). Further, upon recognizing this signal level change, the excimer laser light source starts opening the shutter SH (o). At the time the shutter SH is perfectly opened, the exposure apparatus body starts initialization (collection of the data to create the relation shown in FIG. 2) (p). Upon completion of the initialization, the exposure apparatus body changes the signal SD from Hi to Lo (q), drives the XY-stages for moving the wafer $W_2$ to a predetermined exposure position (r), and then sends the trigger pulse train $S_2$ as the signal EXT. TRG. to start the exposure for the third and subsequent shot areas.

In this sequence, since the halogen concentration within the laser chamber is in excess of a predetermined value after end of the HI operation, the inhibit signal LB is changed from Lo to Hi in FIG. 14(D). While the XY-stages are started to move toward simultaneously with the shutter SH being started to close (i) in the above sequence, it is just required that the XY-stages are moved to the retracted position before start of the initialization.

When the exposure for the second wafer $W_2$ is completed, the exposure apparatus body changes the signal STEP. ST. from Lo to Hi (s) as with the above process. Upon recognizing such a signal level change, the excimer laser light source starts closing the shutter SH (t) and, at the time the shutter SH is perfectly closed, starts self-oscillation at low frequency less than several Hz (u), thereby locking the absolute wavelength, etc. During the time the excimer laser light source is self-oscillating, the exposure apparatus body carries out such operation as replacement of the wafer or detection of a bar mark on the reference mark plate FM by the wafer alignment system 334, followed by changing the signal STEP. ST. from Hi to Lo (v). Upon recognizing this signal level change, the excimer laser light source stops self-oscillation and then starts opening the shutter SH (w). At the time the shutter SH is perfectly opened, the exposure apparatus body drives the moving mirror $M_1$, and the excimer laser light source switches over the oscillation mode from the applied voltage control mode to the energy amount constant mode (x). The exposure apparatus body thereby illuminates the reference mark plate FM by the excimer laser from below to measure a projected position of the slit mark of the reticle R (y) for calculating a baseline amount from this measured value and the mark position detected above by the wafer alignment system 334.

Afterward, the excimer laser light source switches over the oscillation mode to the applied voltage control mode (z), and the exposure apparatus body outputs the signal EXT. TRG. (set $S_3$ of trigger pulse train) to start the exposure operation for a next wafer $W_3$. Subsequently, if the signal REQ. is changed from Lo to Hi during exposure of the third wafer $W_3$, the excimer laser light beam implements the HI operation exactly in the same manner as above.

It is needless to say that while the HI operation has been explained in the foregoing sequence, the PGR operation can be also implemented exactly in the same manner. The excimer laser light source may be of the type that only the HI operation is implemented several times during interval of entire replacement of a gas mixture within the laser chamber, or that one cycle in combination of plural HI operations and the subsequent PGR operation is repeatedly implemented. Moreover, if the excimer laser light source starts the PGR or HI operation, the exposure apparatus body is brought into a standby state or implements with priority other operation (such as wafer replacement or wafer alignment) which necessitates no excimer laser beam.

In this embodiment, as described above, each side of the excimer laser light source and the exposure apparatus body produces the demand signal and the inhibit signal for determining whether the PGR or HI operation should be implemented or not, and determines the timing at which the PGR or HI operation is to be implemented, based on the above four signals in total. It is therefore possible to prevent the PGR or HI operation from being implemented during exposure of one shot area or in a state of excessive halogen gas, and implement the PGR or HI operation at the optimum timing without reducing yield, etc.

In the above (c), (l), (u) of FIG. 14(A), the pulse beam is oscillated at low frequency with the shutter SH kept closed. One reason is necessity of allowing a monochromator within the excimer laser light source to detect change in wavelength of the oscillation pulse beam after its band has been narrowed. Another reason is necessity of allowing a power monitor (photoelectric element) provided within the excimer laser light source 301 to receive the pulse beam to set the pulse energy for exposure of a next shot area. Further, the signal REQ. in this embodiment implies interruption or resumption of exposure on the side of the exposure apparatus body. Accordingly, if the monochromator or the like is designed to detect a state that absolute wavelength control or spectrum half-width control (narrowing) of the excimer laser light source 301 exhibits an inconvenient behavior to the exposure apparatus body during the PGR or HI operation, such an inconvenience can be avoided by changing the signal REQ. to Hi upon detection of the inconvenience.

In the case where the sequence being executed in the exposure apparatus body is permissible in spite of fluctuations in the pulse energy caused by the PGR or HI operation upon an implementation command (from Lo to Hi) with the signal REQ. in this embodiment, the PGR or HI operation may be implemented without interrupting the sequence and closing the shutter SH. As an alternative, it is also feasible to transmit the demand signals for the PGR and HI operations via separate signal lines, and causes the sequence in the exposure apparatus body to determine, for each demand signal, whether or not the PGR or HI operation should be implemented by closing the shutter SH.

The shutter SH may be provided on the side of the exposure apparatus body. Also, while trigger of laser emission used for closing the shutter SH and implementing the PGR or HI operation upon an implementation command with the signal REQ. is given in this embodiment by the self-oscillation on the side of the excimer laser light source, the laser beam may be emitted by the trigger signal (EXT. TRG.) from the exposure apparatus body. Furthermore, while the XY-stages are moved to the predetermined retracted positions during initialization in the above sequence, a shutter may be disposed in the optical path between the beam splitter $BS_1$ and the reticle R in FIG. 10 to cut off the optical path by the shutter during initialization.

Next, another exposure sequence of the apparatus thus arranged will be briefly described with reference to FIG. 15 on only those steps which are not included in the sequence shown in FIG. 14. In the sequence of FIG. 15, the PGR or HI operation will not be implemented during exposure of one wafer. Thus, during exposure of one wafer, the inhibit signal SB on the exposure apparatus body side shown in FIG. 15(F) is held at Hi.

In this example, since the demand signal SA on the exposure apparatus body side shown in FIG. 14(E) is changed from Lo to Hi during exposure of the second wafer $W_2$, the exposure apparatus body checks the signal REQ. and recognizes its level being at Hi, after completing the exposure of the second wafer $W_2$. The exposure apparatus body thereby changes the signal STEP. ST. from Lo to Hi and also changes the signal SD from Lo to Hi for moving the XY-stages 332X, 332Y to the predetermined positions for wafer displacement so that the wafer $W_2$ is carried out of the XY-stages. Upon change of the signal REQ. being from Lo to Hi, the excimer laser light source recognizes it as a start command of the HI operation, and starts closing the shutter SH in response to the signal STEP. ST. from the exposure apparatus body. After perfect closing of the shutter SH, the excimer laser light source implements the HI operation while self-oscillating at proper frequency.

Afterward, at the time the HI (halogen gas injection) operation is completed, the excimer laser light source stops the self-oscillation and changes the signal REQ. from Hi to Lo. Upon recognizing this signal level change, the exposure apparatus body changes the signal STEP. ST. from Hi to Lo as a start command of initialization for the excimer laser light source. Further, upon recognizing this signal level change, the excimer laser light source starts opening the shutter SH. At the time the shutter SH is perfectly opened, the exposure apparatus body starts initialization (collection of the data to create the relation shown in FIG. 2). Upon completion of the initialization, the exposure apparatus body changes the signal SD from Hi to Lo, loads a third wafer $W_2$ on the XY-stages, and then moves the wafer $W_3$ to the predetermined exposure position by the XY-stages. Subsequently, the exposure apparatus body sends the trigger pulse train $S_3$ as the signal EXT. TRG. to start the exposure of each shot area. In view of throughput, the third wafer $W_2$ may be loaded beforehand on the XY-stages during initialization. In this case, however, the pulse beam irradiated through the projection lens PL may, as stray light, expose the third wafer $W_3$ incidental to the initializing operation. It is thus desirable that the third wafer $W_3$ is loaded on the XY-stages after the initializing operation as explained above.

When the exposure for the third wafer $W_3$ is completed, the exposure apparatus body changes the signal STEP. ST. from Lo to Hi. Upon recognizing such a signal level change, the excimer laser light source starts closing the shutter SH and, at the time the shutter SH is perfectly closed, starts self-oscillation at low frequency less than several Hz, thereby locking the absolute wavelength, etc. During the time the excimer laser light source is self-oscillating, the exposure apparatus body carries out such operation as replacement of the wafer or detection of a bar mark on the reference mark plate FM by the wafer alignment system 334, followed by changing the signal STEP. ST. from Hi to Lo. Upon recognizing this signal level change, the excimer laser light source stops self-oscillation and then starts opening the shutter SH. At the time the shutter SH is perfectly opened, the exposure apparatus body drives the moving mirror $M_1$, and the excimer laser light source switches over the oscillation mode from the applied voltage control mode to the energy amount constant mode. The exposure apparatus body thereby illuminates the reference mark plate FM by the excimer laser from below to measure a projected position of the slit mark of the reticle R for calculating a baseline amount from this measured value and the mark position detected above by the wafer alignment system 334.

During the time the projected position of the slit mark of the reticle R is being measured in the energy amount constant mode, i.e., the exposure apparatus body is outputting a trigger pulse train S' shown in FIG. 15(A), the demand signal LA on the side of the excimer laser light source shown in FIG. 15(C) is changed from Lo to Hi and remains at Hi. During the same time, the inhibit signals LB, SB respectively shown in FIGS. (D), (F) are held at Lo. Accordingly, at the time the demand signal LA is changed from Lo to Hi, the signal REQ. is changed from Lo to Hi, allowing the excimer laser light source to implement the HI operation immediately even during measurement of the baseline. On this occasion, the excimer laser light source does not of course close the shutter SH. At the time the signal REQ. is changed from Hi to Lo upon completion of the HI operation, the demand signal LA on the side of the excimer laser light source is also changed from Hi to Lo. Afterward, upon completion of the baseline measurement, the excimer laser light source switches over the oscillation mode to the applied voltage control mode for initialization, and the exposure apparatus body outputs the signal EXT. TRG. (set $S_4$ of trigger pulse train) to start the exposure operation for a next wafer $W_4$.

In this sequence, as described above, the PGR or HI operation can be also prevented from being implemented during exposure of one wafer or in a state of excessive halogen gas, and the PGR or HI operation can be implemented at the optimum timing without reducing yield, etc.

Although the baseline measurement is performed in the time charts shown in FIGS. 14 and 15 before starting the exposure for the wafers $W_3$, $W_4$, it may be performed for each wafer replacement or only at replacement of the reticle.

In this embodiment, as shown in FIG. 12, the demand signal SA on the side of the exposure apparatus body is changed from Lo to Hi at the time when the relation between the applied voltage of the excimer laser light 301 and the energy amount on the reticle surface of the pulse beam actually oscillated under that applied voltage reaches a relation serving as a predetermined judgment basis. At this time, this embodiment determines the exposure pulse number Nexp per one shot, the light reduction coefficient $\beta$, etc. in advance. Therefore, if the light reduction coefficient is given by $\beta < 1$ (with the exposure pulse number Next held constant), the applied voltage can be lowered by increasing the light reduction coefficient $\beta$ when the above relation approaches the judgment basis. In other words, the period in which the PGR or HI operation is implemented can be prolonged. Accordingly, on assumption of the light reduction coefficient $\beta < 1$, the light reduction coefficient $\beta$ may be increased stepwisely (or continuously) when the relation approaches the judgment basis. Note that the exposure pulse number Nexp and the light reduction coefficient $\beta$ are both assumed to be constant in the above embodiment. It is needless to say that in the case of changing the light reduction coefficient $\beta$, the pulse energy Pav (i.e., the applied voltage) is required to be adjusted once again. Even when the light reduction coefficient $\beta$ is equal to 1, exactly the same operating effect as the case of changing the light reduction coefficient $\beta$ can be obtained by increasing the exposure pulse number Nexp. But, increasing the exposure pulse number Nexp leads to a reduction in throughput. In practice, it is therefore desirable that at the time the light reduction coefficient $\beta$ becomes 1 and the above relation reaches the judgment basis, the demand signal SA is changed from Lo to Hi. It should be noticed that when the light reduction coefficient $\beta$ and then the exposure pulse number Nexp are changed as mentioned above, not only the light reduction coefficient $\beta$ and the pulse energy P (applied voltage), but also the exposure pulse number Nexp are required to be set again after implementing the PGR or HI operation.

This embodiment has been explained as setting the oscillation mode of the excimer laser light source 301 always to the applied voltage control mode during exposure of the wafer. However, effectiveness of the applied voltage control mode to perform the exposure of one shot with the lesser pulse number (the number of pulses necessary for achieving smoothing of the interference pattern and the desired exposure amount control accuracy) is realized in the case where the exposure is performed for a resist having relatively high sensitivity. In the case of a resist having relatively low sensitivity, a sufficient number of pulses are required for exposure of one shot and, therefore, the satisfactory exposure amount control accuracy can be achieved through averaging of a number of pulse beams irradiated without performing the exposure in the applied voltage control mode. It is thus a matter of course that the oscillation mode may be switched over between the applied voltage control mode and the energy amount constant mode depending on sensitivity of resists.

Although the above embodiment has been explained in connection with the exposure apparatus using the projection lens, i.e., the so-called stepper, the present invention is also applicable to other exposure apparatus employing any types of techniques in a like manner. Further, although the laser light source has been explained as an excimer laser using rare gas halides, the similar operating effect can be obtained in the cases of using any other laser light sources which require partial gas placement, gas injection, gas circulation or the like within the laser chamber.

According to this embodiment of the present invention, as described above, since the timing to implement partial gas placement or gas injection is determined from an operating state of each of the laser light source and the exposure apparatus body, the gas injection or the like will not be performed at least during exposure of one shot area. Moreover, the information about the relation between the applied voltage (charged voltage) and the energy amount (dose amount) on the surface of a mask or photosensitive substrate of the pulse beam emitted under that applied voltage is updated for each implementation of the gas injection or the like, there is obtained an advantage that satisfactory exposure amount control can be always performed even after the gas injection or the like has been implemented.

What is claimed is:

1. An energy amount control device having a pulse energy generating source which produces pulse energy with a predetermined range of energy fluctuations per oscillation, and adjusting voltage applied to said energy generating source to thereby control an energy amount of the pulse energy, said energy amount control device comprising:

storage means for storing information about the relation between predetermined voltage to produce pulse energy in said energy generating source and an energy amount of the pulse energy emitted from said energy generating source under said predetermined voltage;

energy amount measuring means for detecting the energy amount of the pulse energy actually emitted from said energy generating source;

arithmetic means for updating said information stored in said storage means at predetermined timing based on said predetermined voltage to produce the pulse energy in said energy generating source and the energy amount detected by said energy amount measuring means; and decision means for determining said predetermined voltage corresponding to the energy amount of the pulse energy to be next emitted, based on the information updated by said arithmetic means.

2. An energy amount control device having a pulse energy generating source which produces pulse energy with a predetermined range of energy fluctuations per oscillation, and adjusting voltage applied to said energy generating source to thereby control an energy amount of the pulse energy, comprising:

storage means for storing information about the relation between the applied voltage of said energy generating source and an energy amount of the pulse energy emitted from said energy generating source under said applied voltage;

energy amount measuring means for detecting the energy amount of the pulse energy actually emitted from said energy generating source;

arithmetic means for updating said information stored in said storage means at predetermined timing based on the applied voltage of said energy generating source and the energy amount detected by said energy amount measuring means; and decision means for determining the applied voltage of said energy generating source corresponding to the energy amount of the pulse energy to be next emitted, based on the information updated by said arithmetic means.

3. An energy amount control device according to claim 2, wherein said energy generating source oscillates an excimer laser beam.

4. An energy amount control device according to claim 2, wherein said updating is made per predetermined unit number of pulses.

5. An energy amount control device according to claim 2, wherein said updating is made per unit time.

6. An energy amount control device having a pulse energy generating source which produces pulse energy with a predetermined range of energy fluctuations per oscillation, and adjusting voltage applied to said energy generating source to thereby control an energy amount of the pulse energy, said energy amount control device comprising:

storage means for storing information about the relation between charged voltage at the time of energy oscillation in said energy generating source and an energy amount of the pulse energy emitted from said energy generating source under said charged voltage;

charged voltage measuring means for detecting the charged voltage of said energy generating source;

energy measuring means for detecting an energy amount of the pulse energy actually emitted from said energy generating source;

arithmetic means for updating said information stored in said storage means at predetermined timing based on the applied voltage of said energy generating source and the energy amount detected by said energy amount measuring means; and decision means for determining the applied voltage of said energy generating source corresponding to the energy amount of the pulse energy to be next emitted, based on the information updated by said arithmetic means.

7. An energy amount control device according to claim 6, wherein said energy generating source oscillates an excimer laser beam.

8. An energy amount control device according to claim 6, wherein said updating is made per predetermined unit number of pulses.

9. An energy amount control device according to claim 6, wherein said updating is made per unit time.

10. An exposure apparatus comprising a laser light source which requires at least partial gas replacement or gas injection and emits a coherent pulse beam with a predetermined range of energy fluctuations per oscillation, and means for adjusting voltage applied to said laser light source, wherein the plural pulse beams controlled by said adjusting means to a predetermined energy amount is irradiated to a mask to expose a pattern formed on said mask onto a sensitive substrate with a predetermined exposure amount, said exposure apparatus further comprising:

first control means for outputting signals indicative of whether either one of said partial gas replacement and gas injection of said laser light source is required or not, depending on an exposure state of said sensitive substrate;

second control means for outputting signals indicative of whether either one of said partial gas replacement or gas injection is required or not, depending on an oscillation state of said laser light source, and implementing either one of said partial gas replacement and gas injection after detecting the time at which either one of said partial gas replacement or gas injection of said laser light source is to be performed, based on the signals generated by said second control means and the signals applied from said first control means;

storage means for storing information about the relation between the applied voltage of said laser light source and the energy amount of pulse beam emitted from said laser light source on said mask or sensitive substrate under said applied voltage;

energy amount measuring means for detecting the energy amount of the pulse beam actually emitted from said laser light source on said mask or sensitive substrate;

arithmetic means for updating said information stored in said storage means at predetermined timing based on the applied voltage of said laser light source and the energy amount detected by said energy amount measuring means; and decision means for determining the applied voltage of said laser light source corresponding to the energy amount of the pulse beam to be next emitted, based on said updated information.

11. An exposure apparatus according to claim 10, wherein said updating is made per predetermined unit number of pulses.

12. An exposure apparatus according to claim 10, wherein said updating is made per unit time.

13. An exposure apparatus according to claim 10, wherein said updating is made each time at least either one of said partial gas replacement and gas injection is implemented.

14. An exposure apparatus comprising a laser light source which requires at least partial gas replacement or gas injection and emits a coherent pulse beam with a predetermined range of energy fluctuations per oscillation, and means for adjusting voltage applied to said laser light source, wherein the plural pulse beams controlled by said adjusting means to a predetermined energy amount is irradiated to a mask to expose a pattern formed on said mask onto a sensitive substrate with a predetermined exposure amount, said exposure apparatus further comprising:

first control means for outputting signals indicative of whether either one of said partial gas replacement and gas injection of said laser light source is required or not, depending on an exposure state of said sensitive substrate;

second control means for outputting signals indicative of whether either one of said partial gas replacement or gas injection is required or not, depending on an oscillation state of said laser light source, and implementing either one of said partial gas replacement and gas injection after detecting the time at which either one of said partial gas replacement or gas injection of said laser light source is to be performed, based on the signals generated by said second control means and the signals applied from said first control means;

charged voltage measuring means for detecting charged voltage of said laser light source;

storage means for storing information about the relation between the charged voltage at the time of pulse oscillation in said laser light source and the energy amount of the pulse beam emitted from said laser light source at least on either one of said mask or sensitive substrate under said charged voltage;

energy amount measuring means for detecting the energy amount of the pulse beam actually emitted from said laser light source on said mask or sensitive substrate;

arithmetic means for updating said information stored in said storage means at predetermined timing based on the results measured by said charged voltage measuring means and said energy amount measuring means; and decision means for determining the applied voltage of said laser light source corresponding to the energy amount of the pulse beam to be next emitted, based on said updated information.

15. An exposure apparatus according to claim 14, wherein said updating is made per predetermined unit number of pulses.

16. An exposure apparatus according to claim 14, wherein said updating is made per unit time.

17. An exposure apparatus according to claim 14, wherein said updating is made each time at least either one of said partial gas replacement and gas injection is implemented.

* * * * *

UNITED STATES PATENT AND TRADEMARK OFFICE
CERTIFICATE OF CORRECTION

PATENT NO.   : 5,097,291
DATED        : March 17, 1992
INVENTOR(S)  : Kazuaki SUZUKI It is certified that error appears in the above-identified patent and that said Letters Patent is hereby corrected as shown below:

Col. 44, Claim 6:
line 16, before "measuring" insert --amount--;
line 21, "applied" should read --charged--.

Col. 45, Claim 10:
line 13, "either one of" should be deleted;
line 14, "and" should read --or--;
line 18, "either one of" should be deleted;
line 21, "either one of" should be deleted;
line 22, "and" should read --or--;
line 23, "either one of" should be deleted.

Col. 45, Claim 13:
line 2, "at least either" should be deleted;
line 3, "one of" should be deleted, and "and" should read --or--.

UNITED STATES PATENT AND TRADEMARK OFFICE
CERTIFICATE OF CORRECTION

PATENT NO. : 5,097,291
DATED : March 17, 1992
INVENTOR(S) : Kazuaki SUZUKI It is certified that error appears in the above-identified patent and that said Letters Patent is hereby corrected as shown below:

Col. 46, Claim 14:
    line 13, "either one of" should be deleted;
    line 14, "and" should read --or--;
    line 18, "either one of" should be deleted;
    line 21, "either one of" should be deleted;
    line 22, "and" should read --or--;
    line 23, "either one of" should be deleted;
    line 34, "at least" and "either one of" should be deleted.

Col. 46, Claim 17:
    line 2, "at least either" should be deleted;
    line 3, "one of" should be deleted and "and" should read --or--.

Signed and Sealed this

Ninth Day of November, 1993

Attest:

BRUCE LEHMAN

*Attesting Officer*  *Commissioner of Patents and Trademarks*